US012713894B2

(12) United States Patent
Kwon

(10) Patent No.: US 12,713,894 B2
(45) Date of Patent: Aug. 18, 2026

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventor: Donghoon Kwon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 18/474,345

(22) Filed: Sep. 26, 2023

(65) Prior Publication Data

US 2024/0312902 A1 Sep. 19, 2024

(30) Foreign Application Priority Data

Mar. 17, 2023 (KR) ........................ 10-2023-0035025

(51) Int. Cl.

| | |
|---|---|
| ***H10W 20/42*** | (2026.01) |
| ***H10B 41/40*** | (2023.01) |
| ***H10B 41/50*** | (2023.01) |
| ***H10B 43/10*** | (2023.01) |
| ***H10B 43/27*** | (2023.01) |
| ***H10B 43/35*** | (2023.01) |

(Continued)

(52) U.S. Cl.

CPC ............ *H10W 20/42* (2026.01); *H10B 43/10* (2023.02); *H10B 43/27* (2023.02); *H10B 43/35* (2023.02); *H10B 43/40* (2023.02); *H10B 43/50* (2023.02); *H10B 80/00* (2023.02); *H10W 20/421* (2026.01); *H10W 20/435* (2026.01); *H10W 90/00* (2026.01); *H10B 41/10* (2023.02); *H10B 41/27* (2023.02); *H10B 41/40* (2023.02); *H10B 41/50* (2023.02); *H10W 20/422* (2026.01); *H10W 90/752* (2026.01)

(58) Field of Classification Search

CPC ....... H10B 41/00–70; H10B 43/00–50; H10W 20/42–422

See application file for complete search history.

(56) References Cited

U.S. PATENT DOCUMENTS

| | | | |
|---|---|---|---|
| 10,868,037 | B2 | 12/2020 | Arai et al. |
| 11,107,824 | B2 | 8/2021 | Lee |

(Continued)

FOREIGN PATENT DOCUMENTS

| | | | |
|---|---|---|---|
| KR | 102373845 | B1 | 3/2022 |

*Primary Examiner* — Christine S. Kim
*Assistant Examiner* — Tyler J Wiegand
(74) *Attorney, Agent, or Firm* — Wolf, Greenfield & Sacks, P.C.

(57) ABSTRACT

A three-dimensional semiconductor memory device comprises a first substrate including a cell array region and a contact region, a stack structure including interlayer dielectric layers and gate electrodes on the first substrate, a second dielectric layer on the stack structure, a cell contact plug that extends through the second dielectric layer and the contact region, a selection mold structure on the stack structure and the second dielectric layer, a third dielectric layer on the selection mold structure, and a capping through contact and a dummy through contact that extend through the selection mold structure and are connected to the cell contact plug. The dummy through contact has a second width. The capping through contact has a first width. The second width is different from the first width.

20 Claims, 23 Drawing Sheets

(51) Int. Cl.

| | |
|---|---|
| ***H10B 43/40*** | (2023.01) |
| ***H10B 43/50*** | (2023.01) |
| ***H10B 80/00*** | (2026.01) |
| ***H10W 20/41*** | (2026.01) |
| ***H10W 90/00*** | (2026.01) |
| *H10B 41/10* | (2023.01) |
| *H10B 41/27* | (2023.01) |

(56) References Cited

U.S. PATENT DOCUMENTS

| | | | | |
|---|---|---|---|---|
| 11,374,017 | B2 | 6/2022 | Kanamori et al. | |
| 2021/0143160 | A1 | 5/2021 | Ryu et al. | |
| 2021/0288054 | A1 | 9/2021 | Ryu et al. | |
| 2021/0313344 | A1 | 10/2021 | Ryu et al. | |
| 2022/0139944 | A1 * | 5/2022 | Hwang .................. | H10B 41/27 257/314 |

* cited by examiner

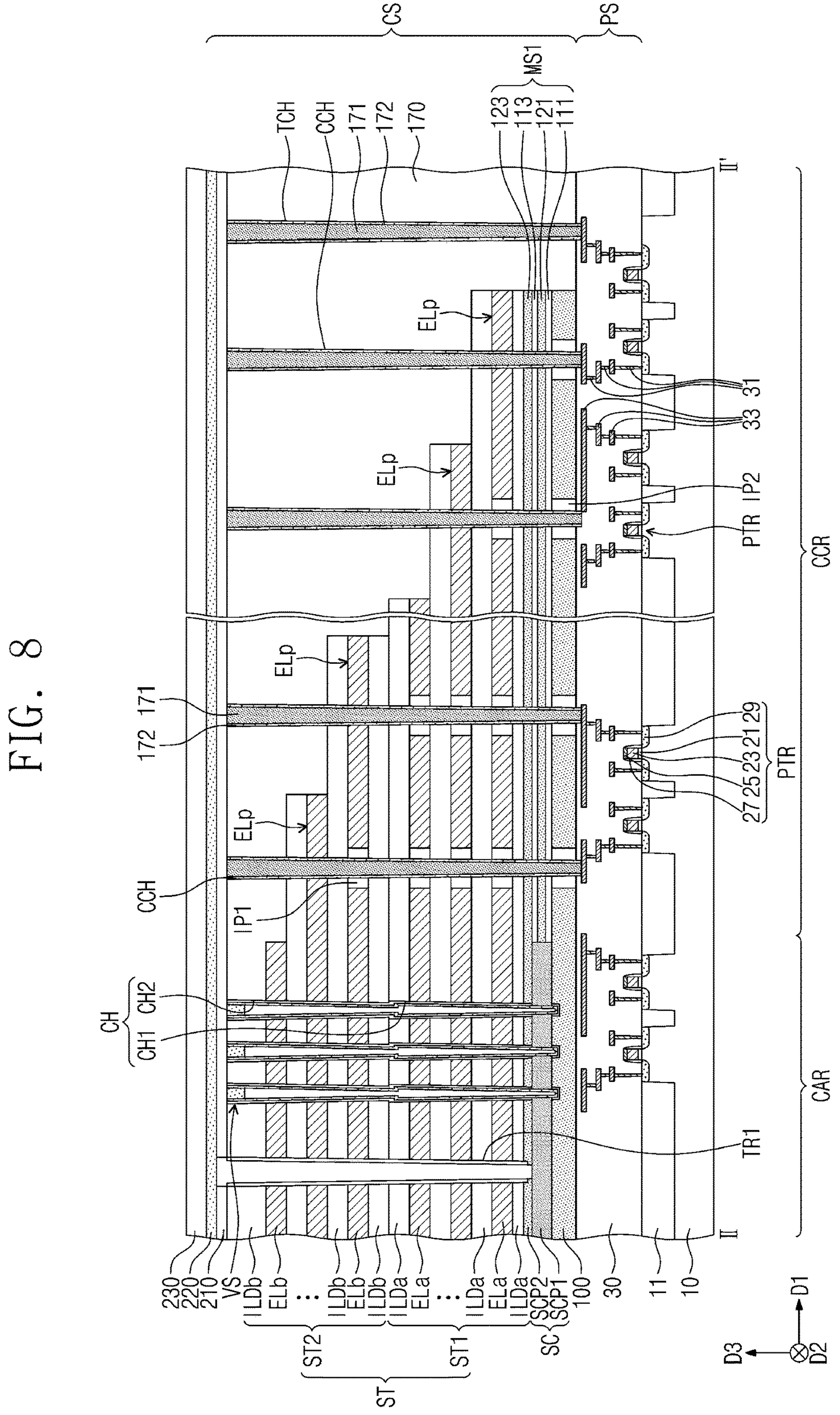

CS
PS
MS1
123
113
121
111
TCH
CCH
170
ELp
IP2
PTR
31
33
CCR
172
171
21
29
23
25
27
PTR
CAR
TR1
IP1
240
230
220
210
VS
ILDb
ELb
ILDa
ELa
SCP2
SCP1
100
30
11
10
ST2
ST1
ST
SC
II
II'
D1
D2
D3

CS
PS
MS1
TCH
CCH
170
123
113
121
111
ELp
31
33
IP2
PTR
CCR
172
171
CCH
CPH
242
221
UVS
BLCH
241
IP1
29
21
23
25
27
CAR
TR1
II
II'
260
250
240
230
220
210
VS
ILDb
ELb
ILDa
ELa
SCP2
SCP1
100
30
11
10
SSLM
ST2
ST1
ST
SC
D1
D2
D3

CCP
IOP
100
ILDa
ELa
ST1
ST
ILDb
ELb
ST2
VS
210
220
SSLM
230
240
250
241
260
40
45
35
30
11
10
IV
IV'
ELp
TCP
CCP
170
CS
IP1
221
242
CTC
DTC
CP
UVS
BLCP
CL1
CL2
BS
PS
27 25 23 21 29
PTR
41
43
31
33
CAR
CCR

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2023-0035025 filed on Mar. 17, 2023 in the Korean Intellectual Property Office, the disclosure of which is hereby incorporated by reference in its entirety.

TECHNICAL FIELD

The present disclosure relate to a three-dimensional semiconductor memory device, and more particularly, to a nonvolatile three-dimensional semiconductor memory device including a vertical channel structure, a method of fabricating the same, and an electronic system including a three-dimensional semiconductor memory device.

BACKGROUND

It may be desirable to have a semiconductor device that is capable of storing a large amount of data in an electronic system. A semiconductor device has been highly integrated to meet high performance and low manufacturing costs. Integration of typical two-dimensional or planar semiconductor devices may be determined by the area occupied by a unit memory cell, such that it is influenced by the level of technology for forming fine patterns. However, the expensive processing equipment used to increase pattern fineness may inhibit the integration of the two-dimensional or planar semiconductor devices.

SUMMARY

Some embodiments of the present disclosure provide a three-dimensional semiconductor memory device with increased reliability and improved electrical properties.

Some embodiments of the present disclosure provide an electronic system including the three-dimensional semiconductor memory device.

An object of the present disclosure is not limited to the mentioned above, and other objects which have not been mentioned above will be clearly understood to those skilled in the art from the following description.

According to some embodiments of the present disclosure, a three-dimensional semiconductor memory device may comprise: a first substrate that includes a cell array region and a contact region that extends from the cell array region; a stack structure that includes interlayer dielectric layers and gate electrodes that are alternately stacked on the first substrate; a second dielectric layer on the stack structure; a cell contact plug that extends through the second dielectric layer and the contact region of the stack structure; a selection mold structure on the stack structure and the second dielectric layer; a third dielectric layer on the selection mold structure; and a capping through contact and a dummy through contact that extend through the selection mold structure and are connected to the cell contact plug. The dummy through contact may have a second width in a direction that is parallel to a top surface of the first substrate. The capping through contact may have a first width in the direction that is parallel to a top surface of the first substrate. The second width may be different from the first width.

According to some embodiments of the present disclosure, a three-dimensional semiconductor memory device may comprise: a first substrate that includes a cell array region and a contact region that extends from the cell array region; a stack structure that includes interlayer dielectric layers and gate electrodes that are alternately stacked on the first substrate; a second dielectric layer on the stack structure; a cell contact plug that extends through the second dielectric layer and the contact region of the stack structure; a selection mold structure on the stack structure and the second dielectric layer; a third dielectric layer on the selection mold structure; a capping through contact and a dummy through contact that extend through the selection mold structure and are connected to the cell contact plug; and a spacer dielectric layer between the selection mold structure and a sidewall of the capping through contact.

According to some embodiments of the present disclosure, an electronic system may comprise: a first substrate that includes a cell array region and a contact region that extends from the cell array region; a three-dimensional semiconductor memory device that includes a peripheral circuit structure on the first substrate, a cell array structure on the peripheral circuit structure, a dielectric layer on the cell array structure, and an input/output pad on the dielectric layer and connected to the peripheral circuit structure; and a controller connected to the three-dimensional semiconductor memory device through the input/output pad. The cell array structure may include: a second substrate on the peripheral circuit structure; a stack structure that includes interlayer dielectric layers and gate electrodes that are alternately stacked on the second substrate; a second dielectric layer on the stack structure; a cell contact plug that extends through the second dielectric layer and the contact region of the stack structure; a selection mold structure on the stack structure and the second dielectric layer; a third dielectric layer on the selection mold structure; and a capping through contact and a dummy through contact that extend through the selection mold structure and are connected to the cell contact plug. The dummy through contact may have a second width in a direction that is parallel to a top surface of the first substrate. The capping through contact may have a first width in the direction that is parallel to the top surface of the first substrate. The second width may be greater than the first width.

BRIEF DESCRIPTION OF DRAWINGS

FIG. 2 illustrates a perspective view of an electronic system that includes a three-dimensional semiconductor memory device according to some embodiments of the present disclosure.

FIGS. 3 and 4 illustrate cross-sectional views respectively taken along lines I-I' and II-II' of FIG. 2.

FIGS. 8, 9, 10, 11, 12, 13, 14, 15, 16, and 17 illustrate a method of fabricating a three-dimensional semiconductor memory device according to some embodiments of the present disclosure.

DETAILED DESCRIPTION OF EMBODIMENTS

Figure 1:
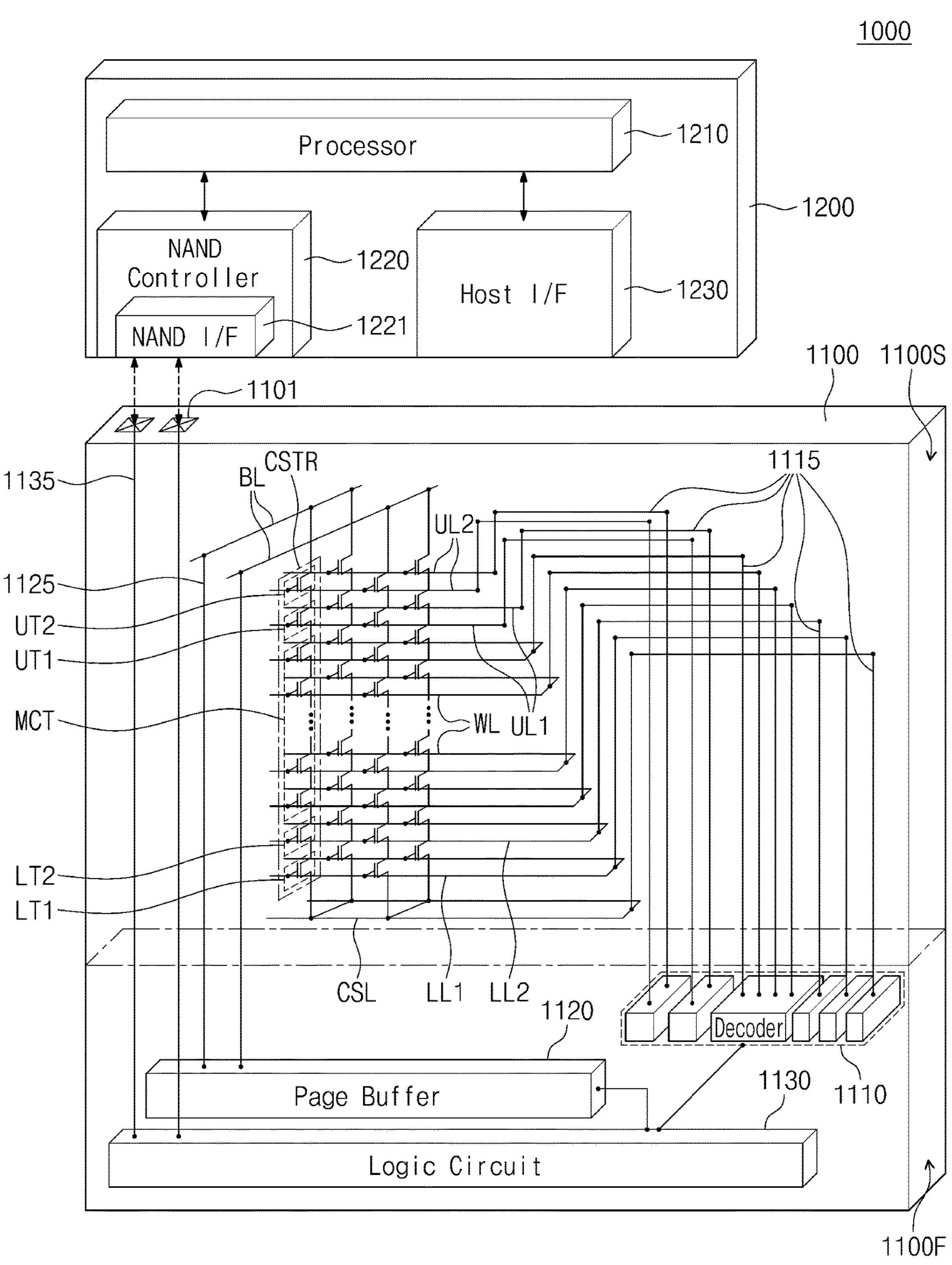
FIG. 1 illustrates a block diagram of an electronic system that includes a three-dimensional semiconductor memory device according to some embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being “on” another element, it can be directly on the other element or intervening elements may also be present. In contrast, when an element is referred to as being “directly on” another element, there are no intervening elements present. Further, spatially relative terms, such as “beneath,” “below,” “lower,” “above,” “upper,” and the like, may be used herein for ease of description to describe one element’s or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device may be otherwise oriented (rotated 90 degrees or at other orientations), and the spatially relative descriptors used herein may be interpreted accordingly.

In addition, unless explicitly described to the contrary, the word “comprises”, and variations such as “comprises” or “comprising”, will be understood to imply the inclusion of stated elements but not the exclusion of any other elements. As used herein, the phrase “at least one of A, B, and C” refers to a logical (A OR B OR C) using a non-exclusive logical OR, and should not be construed to mean “at least one of A, at least one of B and at least one of C.” As used herein, the singular forms “a,” “an” and “the” are intended to include the plural forms as well, unless the context clearly indicates otherwise. It will be further understood that the terms “comprises,” “comprising,” “includes” and/or “including,” when used herein, specify the presence of stated features, steps, operations, elements and/or components, but do not preclude the presence or addition of one or more other features, steps, operations, elements, components and/or groups thereof. The term “and/or” includes any and all combinations of one or more of the associated listed items. As used herein, “an element A is at a same level as element B” refers to at least one surface of element A that is coplanar with at least one surface of element B. The term “connected” may be used herein to refer to a physical and/or electrical connection and may refer to a direct or indirect physical and/or electrical connection.

In conjunction with the accompanying drawings, the following will describe in detail a three-dimensional semiconductor memory device, a method of fabricating the same, and an electronic system including the same.

FIG. 1 illustrates a block diagram of an electronic system that includes a three-dimensional semiconductor memory device according to some embodiments of the present disclosure.

Referring to FIG. 1, an electronic system 1000 according to some embodiments of the present disclosure may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB), a computing system, a medical apparatus, or a communication apparatus, where each includes a single or a plurality of three-dimensional semiconductor memory devices 1100.

The three-dimensional semiconductor memory device 1100 may be a nonvolatile memory device, such as a three-dimensional NAND Flash memory device, which will be discussed below. The three-dimensional semiconductor memory device 1100 may include a first region 1100F and a second region 1100S on the first region 1100F. For example, the first region 1100F may be on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT between the first transistors LT1 and LT2 and the second transistors UT1 and UT2. The number of the first transistors LT1 and LT2 and of the second transistors UT1 and UT2 may vary in other embodiments and is not limited to the example described herein.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erase control transistor LT1 and a ground selection transistor LT2 that are connected in series. The second transistors UT1 and UT2 may include a string selection transistor UT1 and a second erase control transistor UT2 that are connected in series. One or both of the first and second erase control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation on at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include a NAND interface 1221 that processes communication with the three-dimensional semiconductor memory device 1100. The NAND interface 1221 may be used to transfer a control command that controls the three-dimensional semiconductor memory device 1100, data to be written on the memory cell transistors MCT of the three-dimensional semiconductor memory device 1100, and/or data to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
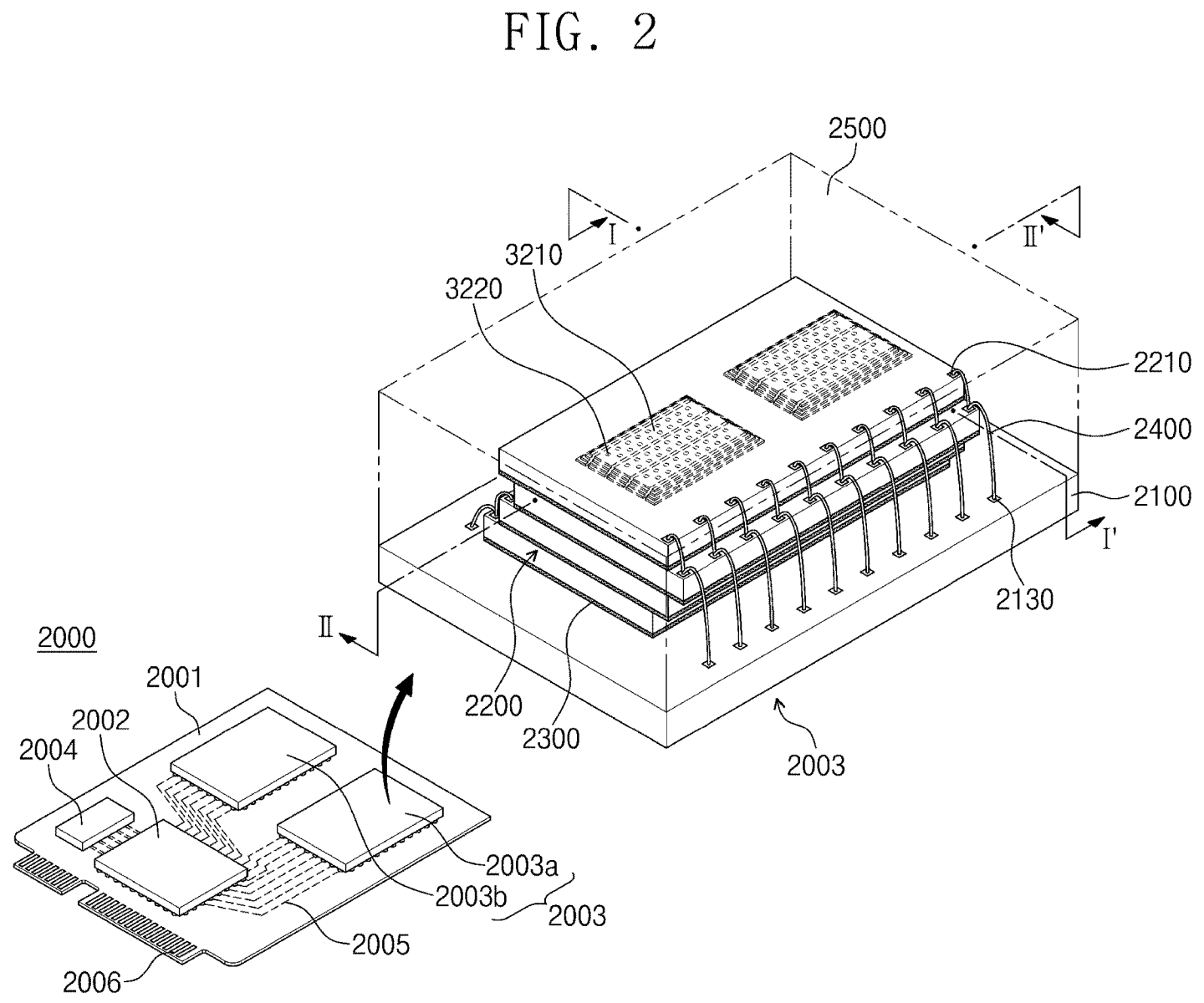

FIG. 2 illustrates a simplified perspective view showing an electronic system that includes a three-dimensional semiconductor memory device according to some embodiments of the present disclosure.

Referring to FIG. 2, an electronic system 2000 according to some embodiments of the present disclosure may include a main board 2001, a controller 2002 mounted on the main board 2001, at least one semiconductor package 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are coupled to an external host. The number and arrangement of the plurality of pins in the connector 2006 are based on a communication interface between the electronic system 2000 and the external host. The electronic system 2000 may communicate with the external host through one or more interfaces, for example, universal serial bus (USB), peripheral component interconnect express (PIC-Express), serial advanced technology attachment (SATA), and M-PHY for universal flash storage (UFS). For example, the electronic system 2000 may operate with power that is supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages 2003*a* and 2003*b* that are spaced apart from each other. Each of the first and second semiconductor packages 2003*a* and 2003*b* may include a plurality of semiconductor chips 2200. Each of the first and second semiconductor package 2003*a* and 2003*b* may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 on the package substrate 2100 and that covers the semiconductor chips 2200 and the connection structures 2400.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device, which will be discussed below.

For example, the connection structures 2400 may be bonding wires that electrically connect the input/output pads 2210 to the package upper pads 2130. On each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some embodiments, on each of the first and second semiconductor packages 2003*a* and 2003*b*, the semiconductor chips 2200 may be electrically connected to each other using through-silicon vias (TSVs) instead of the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through lines provided in the interposer substrate.

Figure 3:
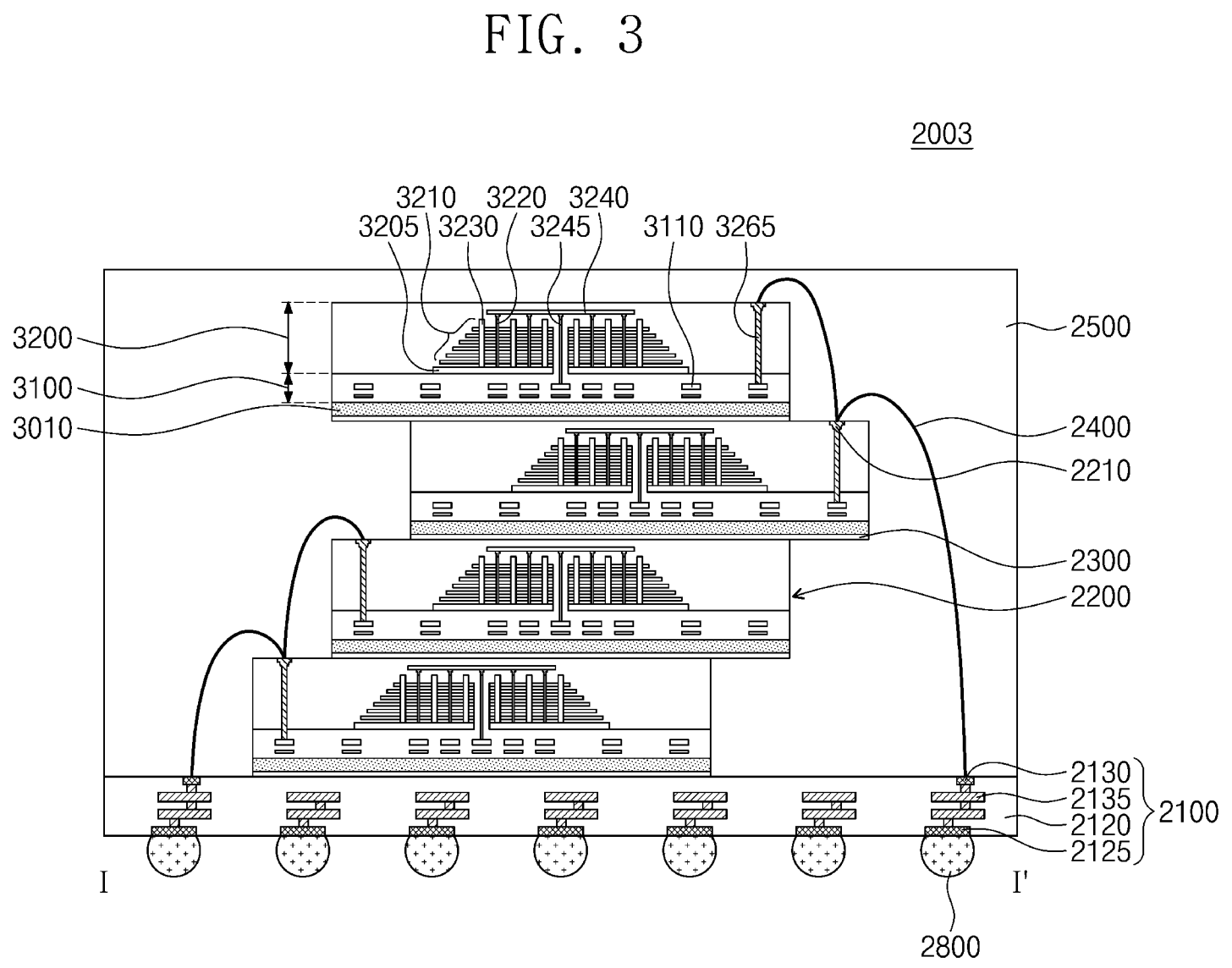
Figure 4:
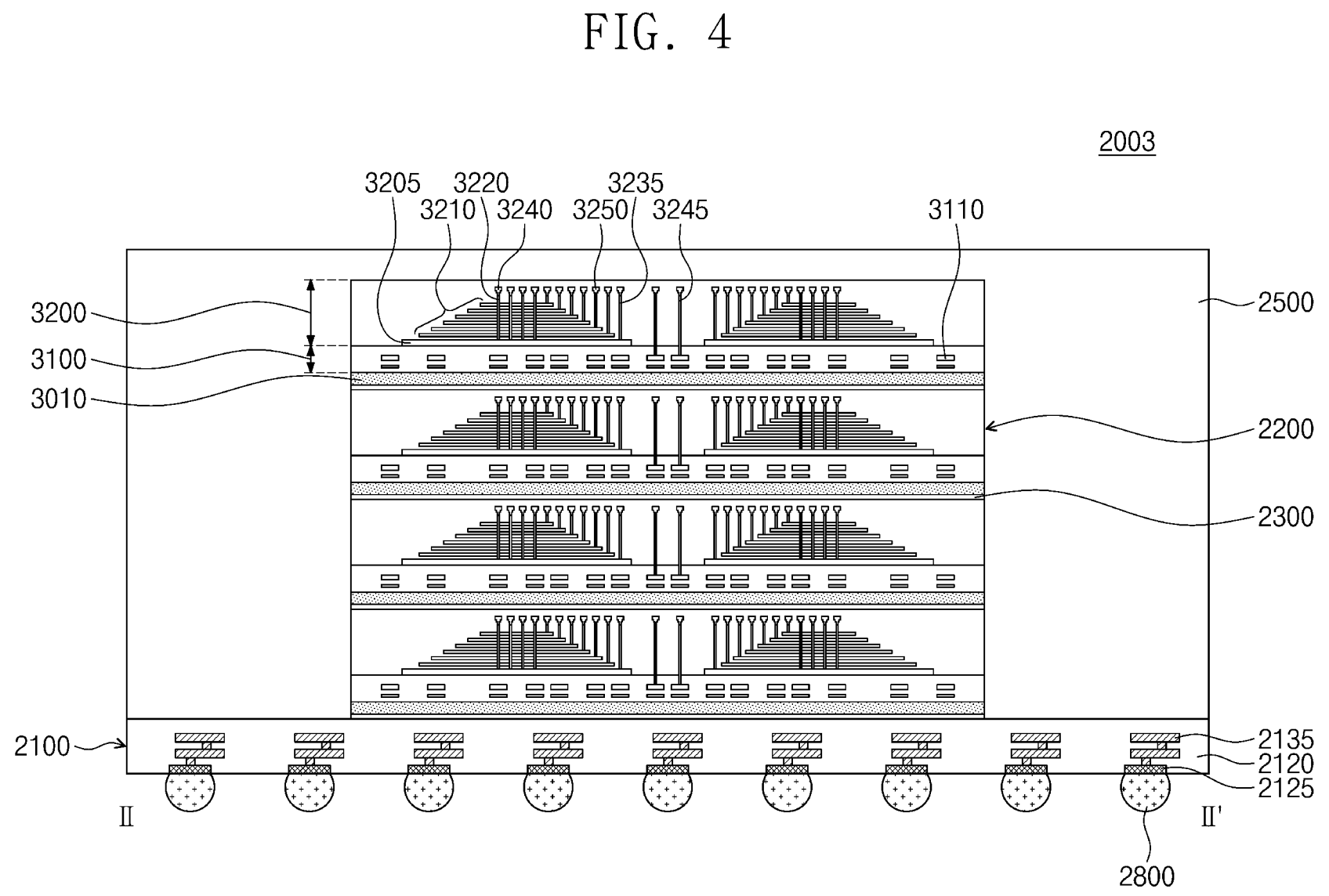

FIGS. 3 and 4 illustrate cross-sectional views respectively taken along lines I-I' and II-II' of FIG. 2, showing a semiconductor package that includes a three-dimensional semiconductor memory device according to some embodiments of the present disclosure.

Referring to FIGS. 3 and 4, a semiconductor package 2003 may include a package substrate 2100, a plurality of semiconductor chips on the package substrate 2100, and a molding layer 2500 on and covering the package substrate 2100 and the plurality of semiconductor chips.

The package substrate 2100 may include a package substrate body 2120, package upper pads 2130 on a top surface of the package substrate body 2120, package lower pads 2125 exposed at a bottom surface of the package substrate body 2120, and internal wiring lines 2135 in the package substrate body 2120 and that electrically connect the package upper pads 2130 to the package lower pads 2125. The package upper pads 2130 may be electrically connected to a plurality of connection structures 2400. The package lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a common source line 3205, a gate stack structure 3210 on the common source line 3205, vertical channel structures 3220 and separation structure 3230 that extend through the gate stack structure 3210, bit lines 3240 electrically connected to the vertical channel structures 3220, gate connection lines 3235 and conductive lines 3250 that are electrically connected to word lines (see WL of FIG. 1) of the gate stack structure 3210.

Each of the semiconductor chips 2200 may include one or more through wiring lines 3245 that extend into the second structure 3200 and are electrically connected to the peripheral wiring lines 3110 of the first structure 3100. The through wiring line 3245 may extend through the gate stack structure 3210, and may further be arranged outside the gate stack structure 3210. Each of the semiconductor chips 2200 may further include an input/output connection line 3265 that is electrically connected to the peripheral wiring lines 3110 of the first structure 3100, and may also further include input/output pads 2210 electrically connected to the input/output connection line 3265.

Figure 5:
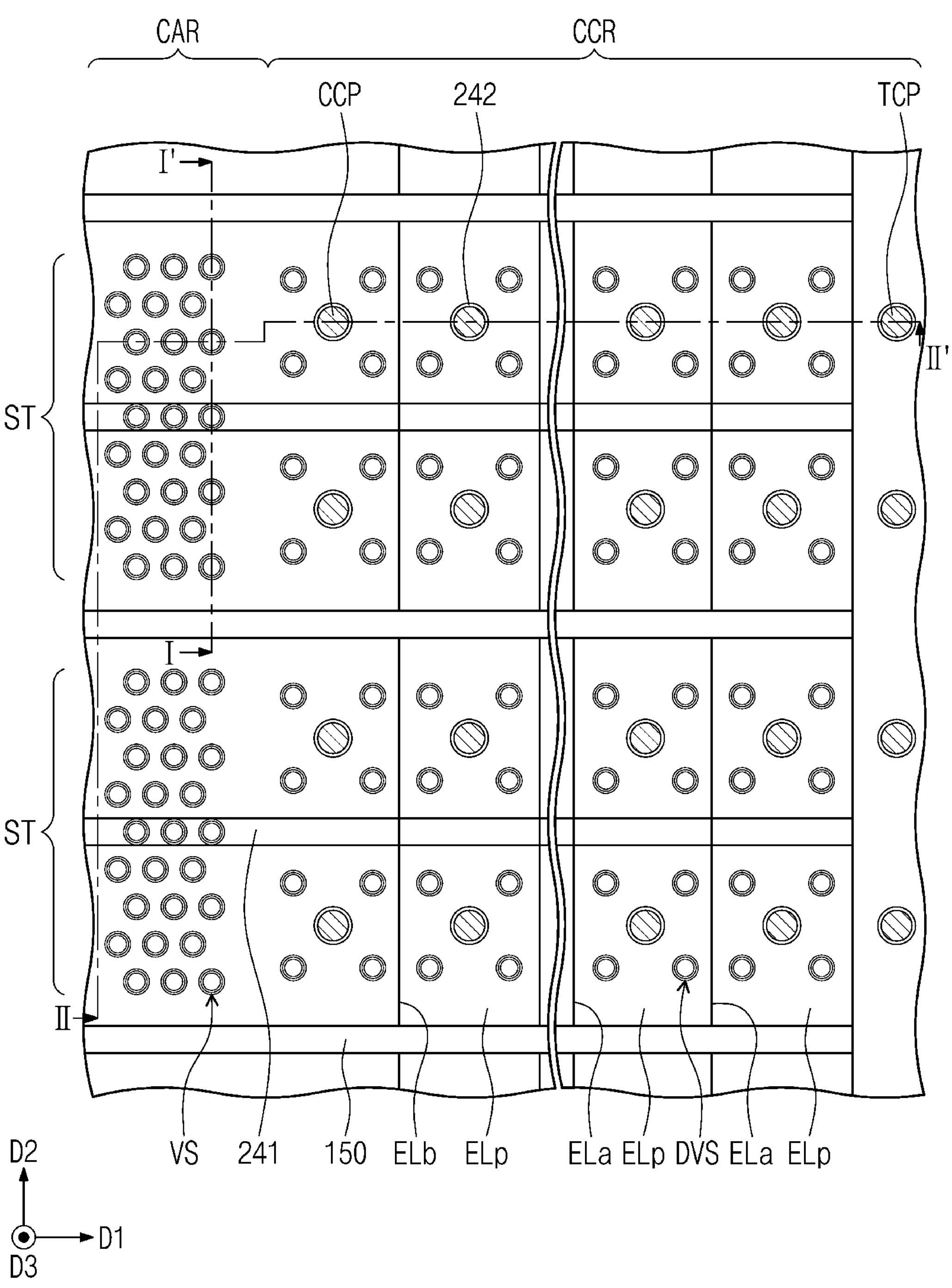
FIG. 5 illustrates a plan view of a three-dimensional semiconductor memory device according to some embodiments of the present disclosure.
Figure 6A:
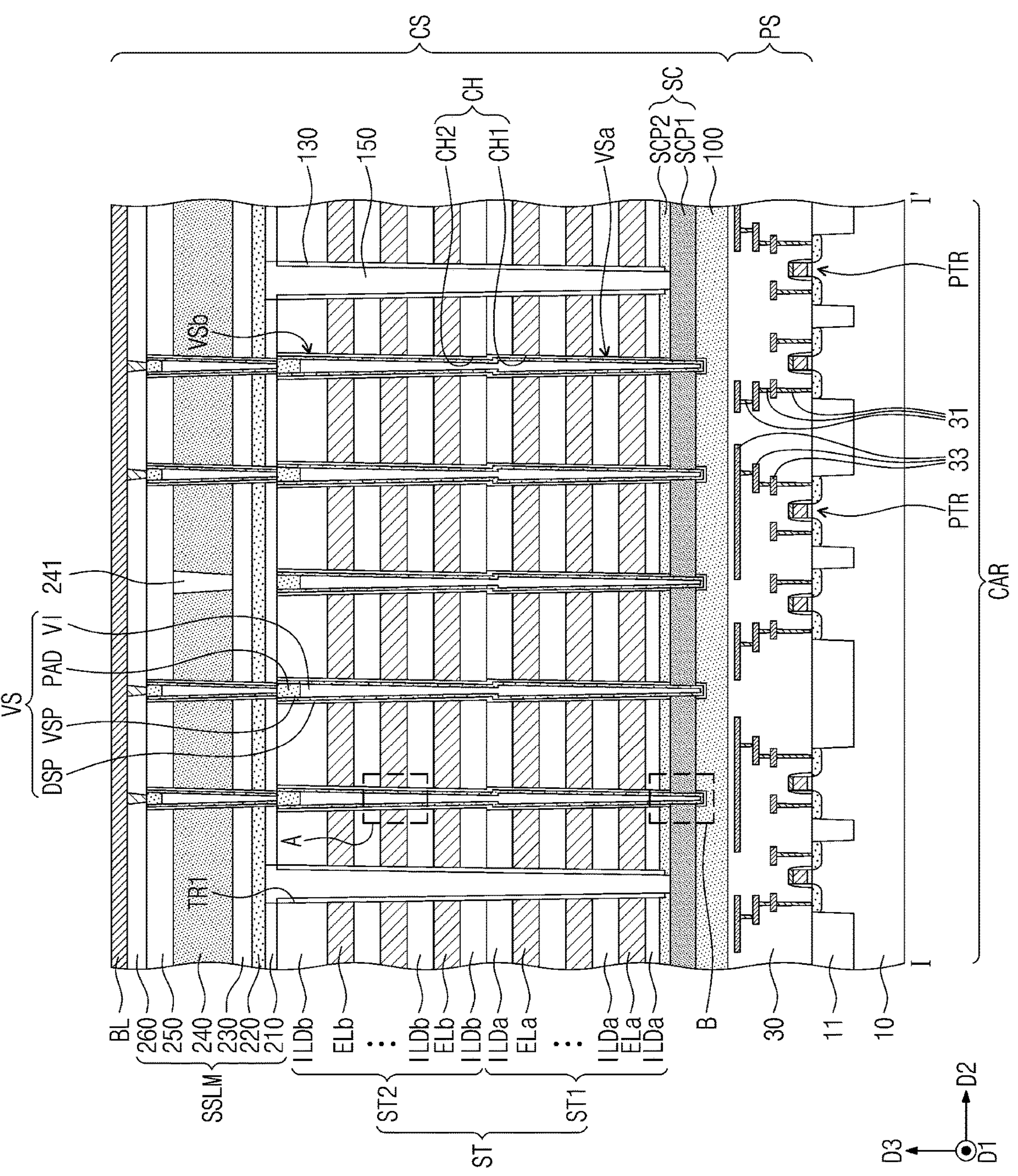
FIGS. 6A and 6B illustrate cross-sectional views respectively taken along lines I-I' and II-II' of FIG. 5.
Figure 6B:
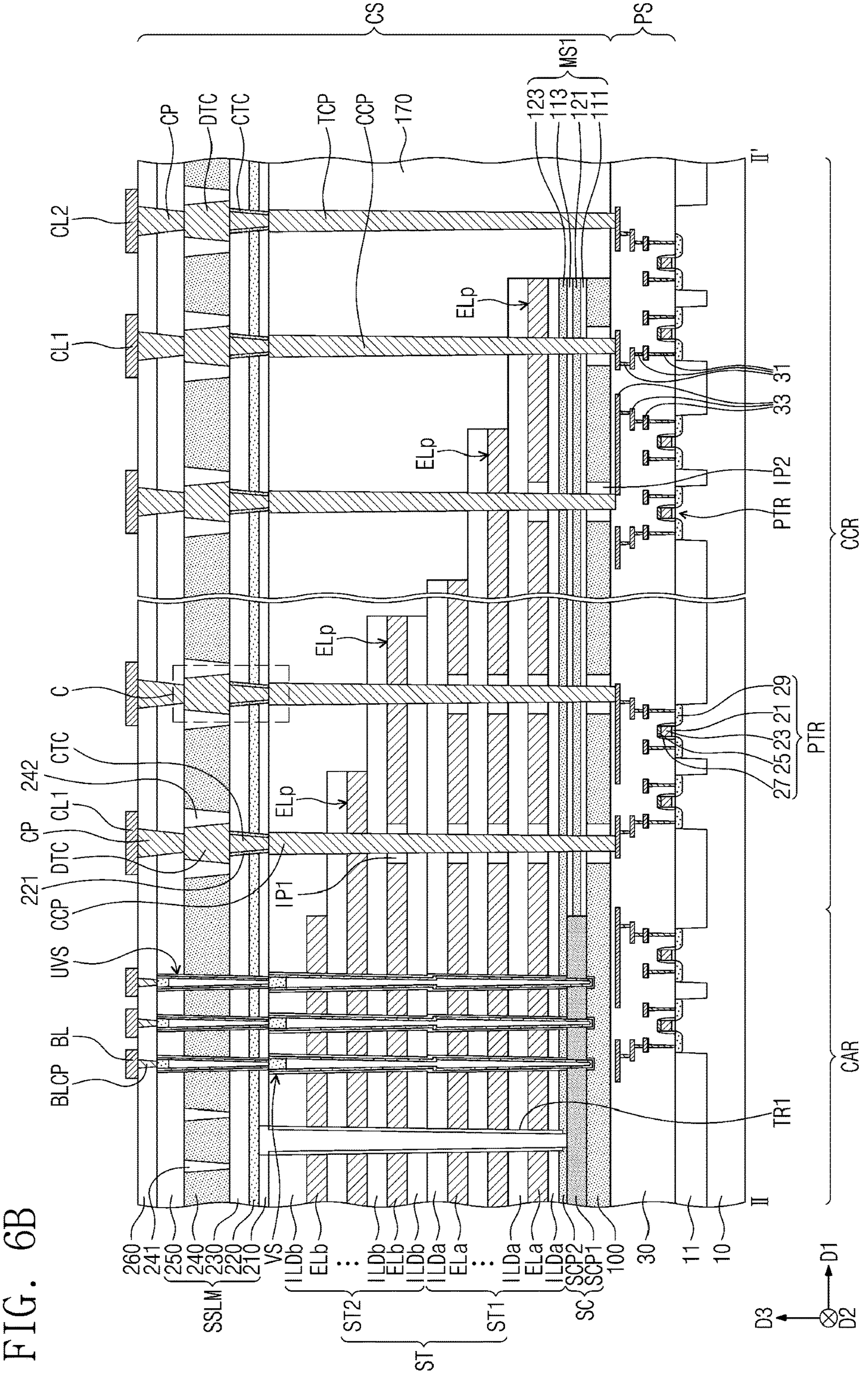

FIG. 5 illustrates a plan view showing a three-dimensional semiconductor memory device according to some embodiments of the present disclosure. FIGS. 6A and 6B illustrate cross-sectional views respectively taken along lines I-I' and II-II' of FIG. 5, showing a three-dimensional semiconductor memory device according to some embodiments of the present disclosure.

Referring to FIGS. 5, 6A, and 6B, a three-dimensional semiconductor memory device according to the present disclosure may include a first substrate 10, a peripheral circuit structure PS on the first substrate 10, and a cell array structure CS on the peripheral circuit structure PS. The first substrate 10, the peripheral circuit structure PS, and the cell array structure CS may respectively correspond to the semiconductor substrate 3010, the first structure 3100 on the semiconductor substrate 3010, and the second structure 3200 on the first structure 3100 of FIGS. 3 and 4.

The first substrate 10 may include a cell array region CAR and a contact region CCR. The first substrate 10 may extend in a first direction D1 directed from the cell array region CAR toward the contact region CCR and in a second direction D2 that intersects the first direction D1. The first substrate 10 may have a top surface perpendicular to a third direction D3 that intersects the first and second directions D1 and D2. For example, the first, second, and third directions D1, D2, and D3 may be orthogonal to each other.

When viewed in plan, the contact region CCR may extend in the first direction D1 (or a direction opposite to the first direction D1) from the cell array region CAR. The cell array region CAR may be an area on which the vertical channel structure 3220, the separation structures 3230, and the bit lines 3240 are provided. The contact region CCR may be an area on which a stepwise structure including pads parts ELp are provided, which will be discussed below. Although not shown, the contact region CCR may extend in the second direction D2 (or a direction opposite to the second direction D2) from the cell array region CAR.

The first substrate 10 may be, for example, a silicon substrate, a silicon-germanium substrate, a germanium substrate, or a monocrystalline epitaxial layer grown on a monocrystalline silicon substrate. The first substrate 10 may include a device isolation layer 11 that defines an active section of the first substrate 10. The device isolation layer 11 may include, for example, silicon oxide.

The peripheral circuit structure PS may be provided on the first substrate 10. The peripheral circuit structure PS may include peripheral circuit transistors PTR on the active section of the first substrate 10, peripheral contact plugs 31, peripheral circuit lines 33 electrically connected to the peripheral circuit transistors PTR through the peripheral contact plugs 31, and a first dielectric layer 30 that surrounds the peripheral circuit transistors PTR, the peripheral contact plugs 31, and the peripheral circuit lines 33. The peripheral circuit structure PS may correspond to the first region 1100F of FIG. 1, and the peripheral circuit lines 33 may correspond to the peripheral wiring lines 3110 of FIGS. 3 and 4.

A peripheral circuit may include the peripheral circuit transistors PTR, the peripheral contact plugs 31, and the peripheral circuit lines 33. For example, the peripheral circuit transistors PTR may correspond to the decoder circuit 1110, the page buffer 1120, and the logic circuit 1130 of FIG. 1. In more detail, each of the peripheral circuit transistors PTR may include a peripheral gate dielectric layer 21, a peripheral gate electrode 23, a peripheral capping pattern 25, a peripheral gate spacer 27, and peripheral source/drain sections 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may be on and/or cover a sidewall of the peripheral gate dielectric layer 21, a sidewall of the peripheral gate electrode 23, and a sidewall of the peripheral capping pattern 25. The peripheral source/drain sections 29 may be provided in the first substrate 10 adjacent to opposite sides of the peripheral gate electrode 23. The peripheral circuit lines 33 may be electrically connected to the peripheral circuit transistors PTR through the peripheral contact plugs 31. Each of the peripheral circuit transistors PTR may be, for example, an NMOS transistor, a PMOS transistor, or a gate-all-around type transistor. For example, the peripheral contact plugs 31 may each have a width in the first direction D1 or the second direction D2 that increases as the distance between the peripheral contact plugs 31 and the first substrate 10 increases in the third direction D3. The peripheral contact plugs 31 and the peripheral circuit lines 33 may include a conductive material, such as metal.

The first dielectric layer 30 may be on the top surface of first substrate 10. On the first substrate 10, the first dielectric layer 30 may cover the peripheral circuit transistors PTR, the peripheral contact plugs 31, and the peripheral circuit lines 33. The first dielectric layer 30 may include a plurality of dielectric layers that constitute a multi-layered structure. For example, the first dielectric layer 30 may include one or more of silicon oxide, silicon nitride, silicon oxynitride, and low-k dielectric materials.

The first dielectric layer 30 may be provided thereon with the cell array structure CS that includes a second substrate 100 and a stack structure ST on the second substrate 100. The second substrate 100 may extend in the first and second directions D1 and D2. The second substrate 100 may not be provided on a partial area of the contact region CCR. The second substrate 100 may be a semiconductor substrate including a semiconductor material. The second substrate 100 may include, for example, at least one selected from silicon (Si), germanium (Ge), silicon germanium (SiGe), gallium arsenic (GaAs), indium-gallium-arsenic (InGaAs), aluminum-gallium-arsenic (AlGaAs), and a combination thereof.

The stack structure ST may be provided on the second substrate 100. The stack structure ST may extend from the cell array region CAR toward the contact region CCR. The stack structure ST may correspond to the gate stack structures 3210 of FIGS. 3 and 4. The stack structure ST may be provided in plural, and the plurality of stack structures ST may be arranged along the second direction D2 and spaced apart in the second direction D2 from each other across a separation structure 150, which will be discussed below. For convenience of description, the following explanation will focus on a single stack structure ST, but this explanation may also be applicable to other stack structures ST.

The stack structure ST may include first and second interlayer dielectric layers ILDa and ILDb and first and second gate electrodes ELa and ELb that are alternately stacked. The first and second gate electrodes ELa and ELb may correspond to the word lines WL, the first lines LL1 and LL2, and the second lines UL1 and UL2 of FIG. 1.

The stack structure ST may include, for example, a first stack structure ST1 on the second substrate 100 and a second stack structure ST2 on the first stack structure ST1. The first stack structure ST1 may include the first interlayer dielectric layers ILDa and the first gate electrodes ELa that are alternately stacked, and the second stack structure ST2 may include the second interlayer dielectric layers ILDb and the second gate electrodes ELb that are alternately stacked. The first and second gate electrodes ELa and ELb may have substantially the same thickness in the third direction D3. In this description below, the term "thickness" may indicate a thickness in the third direction D3.

The first and second gate electrodes ELa and ELb may have their lengths in the first direction D1 that decrease as the distance between the first and second gate electrodes Ela and ELb and the second substrate 100 increase in the third direction D3. For example, each of the first and second gate electrodes ELa and ELb may have a length in the first direction D1 that is greater than a length in the first direction D1 of an immediately overlying gate electrode. A lowermost one of the first gate electrodes ELa included in the first stack structure ST1 may have a maximum length in the first direction D1, and an uppermost one of the second gate electrodes ELb included in the second stack structure ST2 may have a minimum length in the first direction D1.

The first and second gate electrodes ELa and ELb may have their pad parts ELp on the contact region CCR. The pad parts ELp of the first and second gate electrodes ELa and ELb may be arranged at different horizontal and vertical positions. The pad parts ELp may constitute a stepwise structure along the first direction D1.

The stepwise structure may be arranged such that each of the first and second stack structures ST1 and ST2 may have a thickness that decreases as the distance between the first and second stack structures ST1 and ST2 and an outermost one of vertical channel structures VS increases, which will be discussed below. As such, the first and second gate electrodes ELa and ELb may have their sidewalls spaced apart from each other along the first direction D1 at a regular interval when viewed in plan.

The first and second electrodes ELa and ELb may include, for example, at least one selected from doped semiconductors (e.g., doped silicon, etc.), metals (e.g., tungsten, copper, aluminum, etc.), conductive metal nitrides (e.g., titanium nitride, tantalum nitride, etc.), and transition metals (e.g., titanium, tantalum, etc.). For example, the first and second gate electrodes ELa and ELb may include tungsten.

The first and second interlayer dielectric layers ILDa and ILDb may be provided between the first and second gate electrodes ELa and ELb, and may each have a sidewall aligned with that of an underlying one of the first and second gate electrodes ELa and ELb. For example, similar to the first and second gate electrodes ELa and ELb, the first and second interlayer dielectric layers ILDa and ILDb may have their lengths in the first direction D1 that decrease as the distance between first and second interlayer dielectric layers ILDa and ILDb and the second substrate 100 increase in the third direction D3.

A lowermost one of the second interlayer dielectric layers ILDb may be in contact with an uppermost one of the first interlayer dielectric layers ILDa. For example, each of the first and second interlayer dielectric layers ILDa and ILDb may have a thickness less than that of each of the first and second gate electrodes ELa and ELb. For example, a lowermost one of the first interlayer dielectric layers ILDa may have a thickness less than that of each of other first and second interlayer dielectric layers ILDa and ILDb. For example, an uppermost one of the second interlayer dielectric layers ILDb may have a thickness greater than that of each of other first and second interlayer dielectric layers ILDa and ILDb.

Except the lowermost first interlayer dielectric layer ILDa and the uppermost second interlayer dielectric layer ILDb, other first and second interlayer dielectric layers ILDa and ILDb may have substantially the same thickness. This, however, is merely an example, and the first and second interlayer dielectric layers ILDa and ILDb may have other thicknesses that are based on properties of a semiconductor device.

The first and second interlayer dielectric layers ILDa and ILDb may include, for example, one or more of silicon oxide, silicon nitride, silicon oxynitride, and low-k dielectric materials. For example, the first and second interlayer dielectric layers ILDa and ILDb may include high-density plasma (HDP) oxide or tetraethylorthosilicate (TEOS).

A source structure SC may be provided between the lowermost first interlayer dielectric layer ILDa and the second substrate 100 on the cell array region CAR. The source structure SC may correspond to the common source line CSL of FIG. 1 or the common source line 3205 of FIGS. 3 and 4. The source structure SC may include a first source conductive pattern SCP1 and a second source conductive pattern SCP2 that are sequentially stacked on the second substrate 100. The second source conductive pattern SCP2 may be provided between the first source conductive pattern SCP1 and the lowermost first interlayer dielectric layer ILDa. The first source conductive pattern SCP1 may have a thickness greater than that of the second source conductive pattern SCP2. The first and second source conductive patterns SCP1 and SCP2 may include a semiconductor material, such as silicon or a semiconductor material doped with impurities. When the first and second source conductive patterns SCP1 and SCP2 include an impurity-doped semiconductor material, the first source conductive pattern SCP1 may have an impurity concentration greater than that of the second source conductive pattern SCP2.

The first source conductive pattern SCP1 of the source structure SC may be provided only on the cell array region CAR, but not on the contact region CCR. The second source conductive pattern SCP2 of the source structure SC may extend from the cell array region CAR to the contact region CCR. The second source conductive pattern SCP2 on the contact region CCR may be referred to as a "second semiconductor layer 123," which will be discussed below.

A first mold structure MS1 may be provided between the lowermost first interlayer dielectric layer ILDa and the second substrate 100 on the contact region CCR. The first mold structure MS1 may include a first buffer dielectric layer 111, a first semiconductor layer 121, a second buffer dielectric layer 113, and a second semiconductor layer 123 that are sequentially stacked on the second substrate 100.

The first semiconductor layer 121 may be provided between the second substrate 100 and the second semiconductor layer 123. The first buffer dielectric layer 111 may be provided between the second substrate 100 and the first semiconductor layer 121, and the second buffer dielectric layer 113 may be provided between the first semiconductor layer 121 and the second semiconductor layer 123. The first buffer dielectric layer 111 may have a bottom surface substantially coplanar with that of the first source conductive pattern SCP1. The second buffer dielectric layer 113 may have a top surface substantially coplanar with that of the first source conductive pattern SCP1.

The first and second buffer dielectric layers 111 and 113 may include, for example, silicon oxide. The first and second semiconductor layers 121 and 123 may include a semiconductor material, such as silicon.

On the cell array region CAR, a plurality of vertical channel structures VS may extend through the stack structure ST and the source structure SC. The vertical channel structures VS may extend through at least a portion of the second substrate 100, and each of the vertical channel structures VS may have a bottom surface located at a lower level than that of a top surface of the second substrate 100 and that of a bottom surface of the source structure SC. Stated differently, a distance between the first substrate 10 and a bottom surface of each of the vertical channel structures VS is less than a distance between the first substrate 10 and a top surface of the second substrate 100 and a distance between the first substrate 10 and a bottom surface of the source structure SC. For example, the vertical channel structures VS may be in direct contact with the second substrate 100.

When viewed in plan as shown in FIG. 5, the vertical channel structures VS may be arranged in a zigzag fashion along the first direction D1 or the second direction D2. The vertical channel structures VS may not be provided on the contact region CCR. The vertical channel structures VS may correspond to the vertical channel structures 3220 of FIGS. 2 to 4. The vertical channel structures VS may correspond to channels of the first transistors LT1 and LT2 depicted in FIG. 1 and channels of the memory cell transistors MCT depicted in FIG. 1.

The vertical channel structures VS may be provided in vertical channel holes CH that extend through the stack structure ST. Each of the vertical channel holes CH may include a first vertical channel hole CH1 that extends through the first stack structure ST1 and a second vertical channel hole CH2 that extends through the second stack structure ST2. The first and second vertical channel holes CH1 and CH2 of each of the vertical channel holes CH may be connected to each other in the third direction D3.

Each of the vertical channel structures VS may include a first part VSa and a second part VSa. The first part VSa may be provided in the first vertical channel hole CH1, and the second part VSb may be provided in the second vertical channel hole CH2. The second part VSb may be provided on and connected to the first part VSa.

The first part VSa and the second part VSb may each have a width in the first direction D1 or the second direction D2 that increases in the third direction D3. An uppermost portion of the first part VSa may have a width greater than that of a lowermost portion of the second part VSb. For example, each of the vertical channel structures VS may have a sidewall that has a step difference at a boundary between the first part VSa and the second part VSb. This, however, is merely an example, and the present disclosure is not limited thereto. For example, each of the vertical channel structures VS may have a sidewall that has three or more step differences at different levels or that is flat with no step difference.

Each of the vertical channel structures VS may include a data storage pattern DSP and a vertical semiconductor pattern VSP that are sequentially provided on an inner sidewall of the vertical channel holes CH, a buried dielectric pattern VI that fills an inner space surrounded by the vertical semiconductor pattern VSP, and a conductive pad PAD on the buried dielectric pattern VI. The conductive pad PAD may be provided in a space surrounded by the buried dielectric pattern VI and the data storage pattern DSP (or the vertical semiconductor pattern VSP). The vertical channel structures VS may each have a top surface that has, for example, a circular shape, an oval shape, or a bar shape. The data storage pattern DSP may be adjacent to the stack structure ST to cover sidewalls of the first and second interlayer dielectric layers ILDa and ILDb and sidewalls of the first and second gate electrodes ELa and ELb. The vertical semiconductor pattern VSP may conformally cover an inner sidewall of the data storage pattern DSP.

The vertical semiconductor pattern VSP may be provided between the data storage pattern DSP and the buried dielectric pattern VI. The vertical semiconductor pattern VSP may have a macaroni shape or a pipe shape whose bottom end is closed. The data storage pattern DSP may have a cylindrical shape whose bottom end is opened.

The vertical semiconductor pattern VSP may include, for example, an impurity-doped semiconductor material, an impurity-undoped intrinsic semiconductor material, or a polycrystalline semiconductor material. As discussed below with reference to FIG. 7B, the vertical semiconductor pattern VSP may contact a portion of the source structure SC. The conductive pad PAD may include, for example, an impurity-doped semiconductor material or a conductive material.

On the contact region CCR, a plurality of dummy vertical channel structures DVS may extend through a second dielectric layer 170, which will be discussed below, the stack structure ST, and the first mold structure MS1. For example, the dummy vertical channel structures DVS may extend through the pad parts ELp of the first and second gate electrodes ELa and ELb. The dummy vertical channel structures DVS may be provided around cell contact plugs CCP, which will be discussed below. The dummy vertical channel structures DVS may not be provided on the cell array region CAR. The dummy vertical channel structures DVS and the vertical channel structures VS may be formed simultaneously with each other and may have substantially the same structure. According to some embodiments, the dummy vertical channel structures DVS may not be provided or not be formed simultaneously with the vertical channel structures VS.

On the contact region CCR, a second dielectric layer 170 may be provided on and cover the stack structure ST and a portion of the first dielectric layer 30. For example, the second dielectric layer 170 may cover the stepwise structure of the stack structure ST, and may be provided on the pad parts ELp of the first and second gate electrodes ELa and ELb. The second dielectric layer 170 may have a top surface that is substantially flat. The top surface of the second dielectric layer 170 may be substantially coplanar with an uppermost surface of the stack structure ST. For example, the top surface of the second dielectric layer 170 may be substantially coplanar with that of the uppermost second interlayer dielectric layer ILDb of the stack structure ST.

The second dielectric layer 170 may include a single or a plurality of stacked dielectric layers. The second dielectric layer 170 may include a dielectric material, for example, one or more of silicon oxide, silicon nitride, silicon oxynitride, and low-k dielectric materials. The second dielectric layer 170 may include a dielectric material different from that of the first and second interlayer dielectric layers ILDa and ILDb of the stack structure ST. For example, when the first and second interlayer dielectric layers ILDa and ILDb of the stack structure ST include high-density plasma oxide, the second dielectric layer 170 may include tetraethylorthosilicate (TEOS).

A selection mold structure SSLM and a third dielectric layer 260 may be provided on the second dielectric layer 170 and the stack structure ST. The selection mold structure SSLM may include a first capping dielectric layer 210, a second capping dielectric layer 220, a third capping dielectric layer 230, a selection semiconductor layer 240, and a mold dielectric layer 250 that are sequentially stacked. The first capping dielectric layer 210 may be on and cover a top surface of the second dielectric layer 170, the top surface of the uppermost second interlayer dielectric layer ILDb of the stack structure ST, and top surfaces of the vertical channel structures VS.

The first capping dielectric layer 210, the second capping dielectric layer 220, the third capping dielectric layer 230, the mold dielectric layer 250, and the third dielectric layer 260 may each include a single dielectric layer or a plurality of stacked dielectric layers. The first capping dielectric layer 210, the second capping dielectric layer 220, the third capping dielectric layer 230, the mold dielectric layer 250, and the third dielectric layer 260 may each include, for example, one or more of silicon oxide, silicon oxynitride, and low-k dielectric materials. The first capping dielectric layer 210, the third capping dielectric layer 230, the mold dielectric layer 250, and the third dielectric layer 260 may each include, for example, a dielectric material substantially the same as that of the second dielectric layer 170. The second capping dielectric layer 220 may include silicon nitride. The selection semiconductor layer 240 may include, for example, polycrystalline silicon.

When the stack structure ST is provided in plural, a separation structure 150 may be provided in a first trench TR1 that runs in the first direction D1 across between the plurality of stack structures ST. The first trench TR1 may extend along the first direction D1 from the cell array region CAR toward the contact region CCR of the first substrate 10. The separation structure 150 may be spaced apart in the second direction D2 from the vertical channel structures VS. For example, the separation structure 150 may have a top surface located at a higher level than that of the top surfaces of the vertical channel structures VS. Stated differently, a distance between the first substrate 10 (or the second substrate 100) and a top surface of the separation structure 150 is greater than a distance between the first substrate 10 (or the second substrate) and top surfaces of the vertical channel structures VS. The top surface of the separation structure 150 may be coplanar with that of the first capping dielectric layer 210. The separation structure 150 may have a bottom surface which is substantially coplanar with that of the second source conductive pattern SCP2 and which is located at a higher level than that of the top surface of the second substrate 100.

The separation structure 150 may be provided in plural, and the plurality of separation structures 150 may be spaced apart in the second direction D2 from each other across the stack structure ST. The separation structure 150 may correspond to the separation structure 3230 of FIGS. 3 and 4.

A separation spacer 130 may be provided between the separation structure 150 and the stack structure ST and may surround the separation structure 150. The separation spacer 130 may conformally cover the sidewalls of the first and second interlayer dielectric layers ILDa and ILDb and the sidewalls of the first and second gate electrodes ELa and ELb. The separation structure 150 and the separation spacer 130 may include, for example, silicon oxide.

Cell contact plugs CCP may be provided that extend through the second dielectric layer 170 and are connected to the first and second gate electrodes ELa and ELb. Each of the cell contact plugs CCP may extend through one of the first and second interlayer dielectric layers ILDa and ILDb to directly contact one of the pad parts ELp of the first and second gate electrodes ELa and ELb. The cell contact plugs CCP may correspond to the gate connection lines 3235 of FIG. 4.

Each of the cell contact plugs CCP may be spaced apart in a horizontal direction and electrically separated from the first and second gate electrodes ELa and ELb below the pad parts ELp across a first dielectric pattern IP1, which horizontal direction is one direction on a plane parallel to the first direction D1 and the second direction D2. Each of the cell contact plugs CCP may be spaced apart in the horizontal direction and electrically separated from the second substrate 100 across a second dielectric pattern IP2. The first and second dielectric patterns IP1 and IP2 may include the same material as that of the first and second interlayer dielectric layers ILDa and ILDb of the stack structure ST. Each of the cell contact plugs CCP may have a bottom surface located at a lower level than that of a bottom surface of the second substrate 100. Stated differently, a distance between the first substrate 10 and a bottom surface of the cell contact plugs CCP is less than a distance between the first substrate and a bottom surface of the second substrate 100. A height in the third direction D3 of each of the cell contact plugs CCP may be substantially the same as a height in the third direction D3 of a peripheral contact plug TCP.

The peripheral contact plug TCP may extend through the second dielectric layer 170 and at least a portion of the first dielectric layer 30 to be electrically connected to the peripheral circuit transistor PTR of the peripheral circuit structure PS. In other embodiments, the peripheral contact plug TCP may be provided in plural. The peripheral contact plug TCP may be spaced apart in the first direction D1 from the second substrate 100, the source structure SC, and the stack structure ST. The peripheral contact plug TCP may correspond to the through wiring line 3245 of FIGS. 3 and 4.

The cell contact plug CCP and the peripheral contact plug TCP may include a conductive pattern including at least one metal selected from aluminum, copper, tungsten, molybdenum, and cobalt and a barrier pattern including a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CON) layer, and a platinum nitride (PtN) layer.

For example, the cell contact plug CCP and the peripheral contact plug TCP may each have a width in the first direction D1 or the second direction D2 that increases in the third direction D3.

On the cell array region CAR, a plurality of upper vertical channel structures UVS may be provided that extend through the selection mold structure SSLM. When viewed in plan as shown in FIG. 5, the upper vertical channel structures UVS may be arranged in a zigzag fashion along the first direction D1 or the second direction D2. The upper vertical channel structure UVS may vertically overlap (e.g., in the third direction D3) with the vertical channel structure VS, and when viewed in plan, the upper vertical channel structure UVS and the vertical channel structure VS may be provided at substantially the same position and electrically connected to each other. The upper vertical channel structure UVS may have a top surface coplanar with that of the mold dielectric layer 250. The upper vertical channel structures UVS may not be provided on the contact region CCR. The upper vertical channel structures UVS may correspond to the vertical channel structures 3220 of FIGS. 2 to 4. The upper vertical channel structures UVS may correspond to channels of the second transistors UT1 and UT2 depicted in FIG. 1.

A separation dielectric pattern 241 may be provided to extend in the third direction D3 through the selection semiconductor layer 240 and to extend in the first direction D1 across the selection semiconductor layer 240. The separation dielectric pattern 241 may extend along the first direction D1. The separation dielectric pattern 241 may have a top surface coplanar with that of the selection semiconductor layer 240. The upper vertical channel structure UVS may not be provided on a portion where the separation dielectric pattern 241 is located. For example, the separation dielectric pattern 241 may be horizontally spaced apart from the upper vertical channel structure UVS.

Between two separation structures 150 that are spaced apart from each other in the second direction D2, the separation dielectric pattern 241 may separate a string selection line of a three-dimensional NAND Flash memory device.

A separation dummy pattern 242 may be provided in the selection semiconductor layer 240. The separation dummy pattern 242 may include, for example, silicon oxide. A dummy through contact DTC may be disposed in and extend through the separation dummy pattern 242. The separation dummy pattern 242 may be interposed between the selection semiconductor layer 240 and a sidewall part of the dummy through contact DTC. The separation dummy pattern 242 may have a top surface coplanar with that of the selection semiconductor layer 240.

A capping through contact CTC may be provided to extend through the first capping dielectric layer 210, the second capping dielectric layer 220, and the third capping dielectric layer 230. The capping through contact CTC may be electrically connected to the cell contact plug CCP or the peripheral contact plug TCP. The capping through contact CTC may be on and vertically overlap (e.g., in the third direction D3) with the cell contact plug CCP or the peripheral contact plug TCP.

Contact plugs CP may extend through the third dielectric layer 260 and the mold dielectric layer 250. The contact plug CP may be electrically connected to the dummy through contact DTC. Each of the contact plugs CP may be on and vertically overlap (e.g., in the third direction D3) with the dummy through contact DTC.

Bit-line contact plugs BLCP may extend through the third dielectric layer 260 to be electrically connected to the upper vertical channel structures UVS. The bit-line contact plugs BLCP may include a metallic material, such as tungsten.

The third dielectric layer 260 may be provided thereon with bit lines BL connected to the bit-line contact plugs BLCP. The bit lines BL may correspond to the bit lines BL of FIG. 1 and/or the bit lines 3240 of FIGS. 3 and 4.

The third dielectric layer 260 may be provided thereon with first conductive lines CL1 and second conductive lines CL2 that are connected to the contact plugs CP. The first conductive lines CL1 may be electrically connected to the cell contact plugs CCP through corresponding contact plugs CP, corresponding dummy through contacts DTC, and corresponding capping through contacts CTC. The second conductive lines CL2 may be electrically connected to the peripheral contact plugs TCP through corresponding contact plugs CP, corresponding dummy through contacts DTC, and corresponding capping through contacts CTC. The first and second conductive lines CL1 and CL2 may correspond to the conductive lines 3250 of FIG. 4.

A conductive material, such as metal, may be included in the bit-line contact plugs BLCP, the cell contact plugs CCP, the peripheral contact plug TCP, the capping through contact CTC, the dummy contact plugs DTC, the contact plugs CT, the bit lines BL, and the first and second conductive lines CL1 and CL2. Although not shown, the third dielectric layer 260 may be provided thereon with additional wiring lines and additional vias that are electrically connected to the bit lines BL and the first and second conductive lines CL1 and CL2.

Figure 7A:
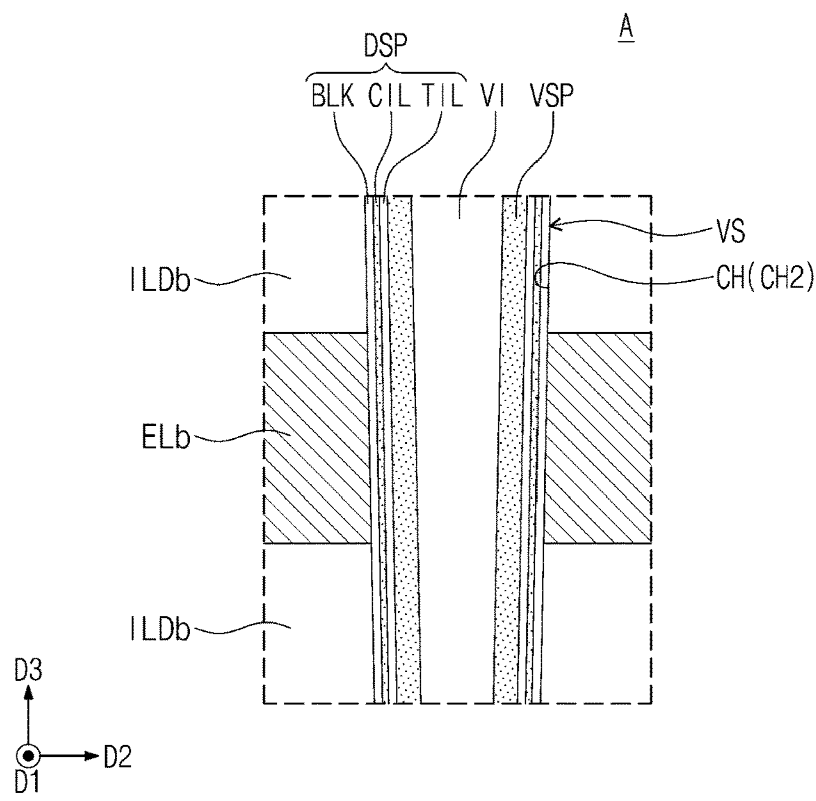
FIG. 7A illustrates an enlarged view of section A depicted in FIG. 6A.
Figure 7B:
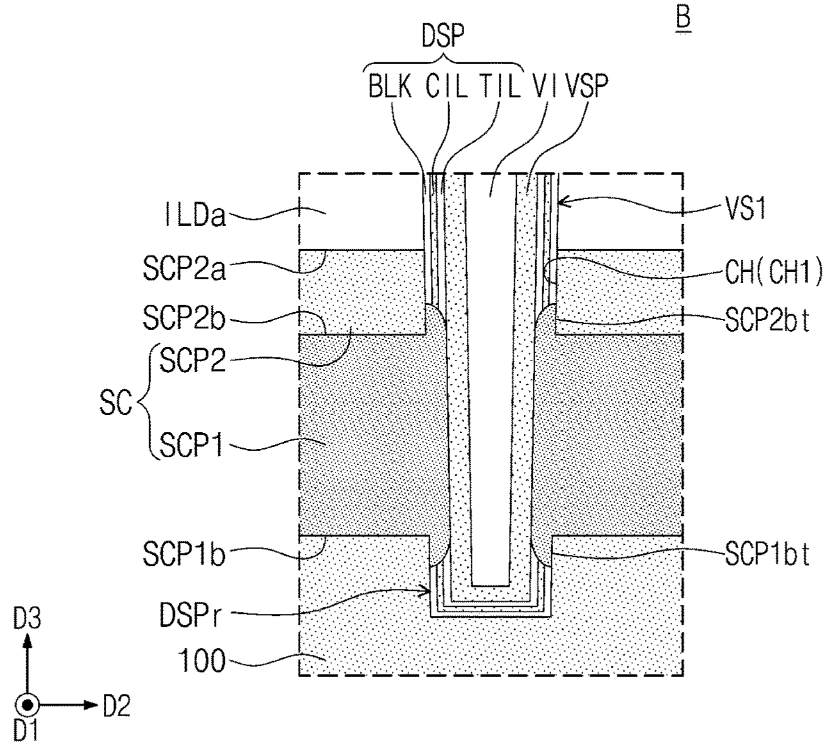
FIG. 7B illustrates an enlarged view of section B depicted in FIG. 6A.

FIG. 7A illustrates an enlarged view of section A depicted in FIG. 6A, partially showing a three-dimensional semiconductor memory device according to some embodiments of the present disclosure. FIG. 7B illustrates an enlarged view of section B depicted in FIG. 6A, partially showing a three-dimensional semiconductor memory device according to some embodiments of the present disclosure.

Referring to FIGS. 6A, 7A, and 7B, the source structure SC is illustrated and includes the first and second source conductive patterns SCP1 and SCP2, and one of the vertical channel structures VS is illustrated and includes the data storage pattern DSP, the vertical semiconductor pattern VSP, the buried dielectric pattern VI, and a lower data storage pattern DSPr. For convenience of description, the following explanation will focus on a single stack structure ST and a single vertical channel structure VS, but this explanation may also be applicable to other vertical channel structures VS that extend through other stack structures ST.

The data storage pattern DSP may include a blocking dielectric layer BLK, a charge storage layer CIL, and a tunneling dielectric layer TIL that are sequentially stacked. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK may conformally cover an inner wall of the vertical channel hole CH.

The blocking dielectric layer BLK, the charge storage layer CIL, and the tunneling dielectric layer TIL may extend in the third direction D3 between the vertical semiconductor pattern VSP and the first and second gate electrodes ELa and ELb and between the vertical semiconductor pattern VSP and the first and second interlayer dielectric layers ILDa and ILDb. The data storage pattern DSP may store and/or change data by using Fowler-Nordheim tunneling induced by a voltage difference between the vertical semiconductor pattern VSP and the first and second gate electrodes ELa and ELb. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1*bt* located at a level higher than that of a bottom surface SCP2*b* of the second source conductive pattern SCP2 or lower than that of a bottom surface SCP1*b* of the first source conductive pattern SCP1. The protrusions SCP1*bt* may be located at a lower level than that of a top surface SCP2*a* of the second source conductive pattern SCP2. The protrusions SCP1*bt* may each have, for example, a curved shape at a surface in contact with the data storage pattern DSP or the lower data storage pattern DSPr.

Figure 7C:
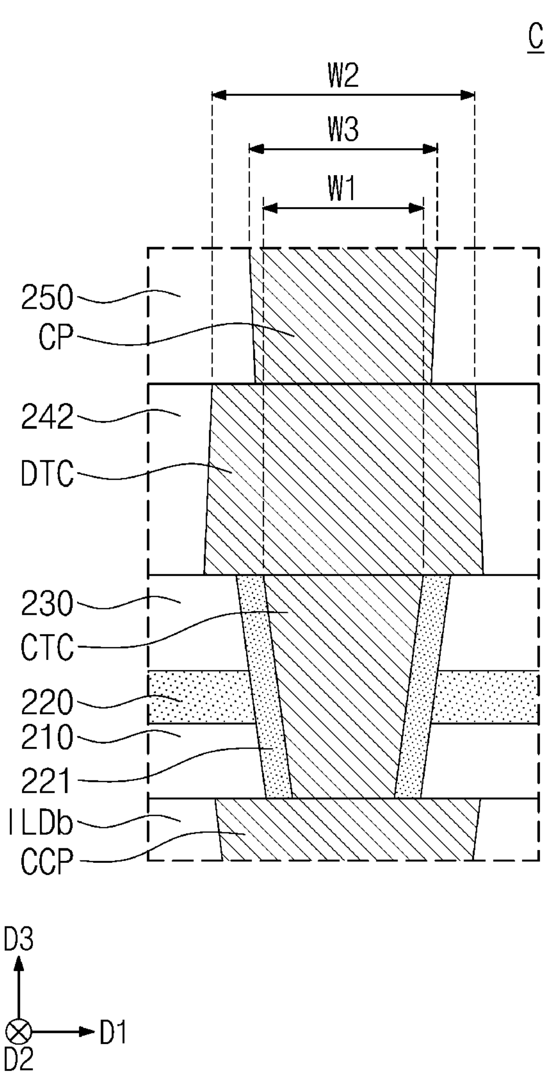
FIGS. 7C and 7D illustrate enlarged views of section C depicted in FIG. 6B.
Figure 7D:
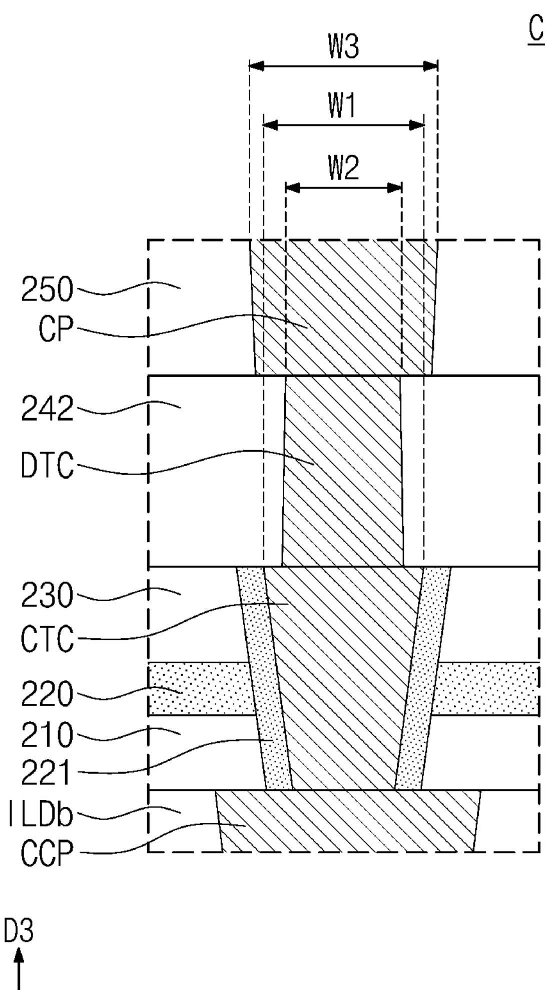

FIGS. 7C and 7D illustrate enlarged view of section C depicted in FIG. 6B, partially showing a three-dimensional semiconductor memory device according to some embodiments of the present disclosure.

Referring to FIGS. 6B, a spacer dielectric layer 221 may be provided between the selection mold structure SSLM and a sidewall part of the capping through contact CTC. For example, the spacer dielectric layer 221 may be interposed between the sidewall part of the capping through contact CTC and each of the first, second, and third capping dielectric layers 210, 220, and 230. An upper portion of the spacer dielectric layer 221 may be in contact with a lower portion of the dummy through contact DTC, and a lower portion of the spacer dielectric layer 221 may be in contact with an upper portion of the cell contact plug CCP or an upper portion of the peripheral contact plug TCP. The spacer dielectric layer 221 may have a top surface coplanar with a bottom surface of the selection semiconductor layer 240. The spacer dielectric layer 221 may include, for example, silicon oxide.

The capping through contact CTC may have a first width W1. The first width W1 may indicate a width, which is measured at an arbitrary vertical level, in the first direction D1 or the second direction D2 of the capping through contact CTC. The dummy through contact DTC may have a second width W2. The second width W2 may indicate a width, which is measured at an arbitrary vertical level, in the first direction D1 or the second direction D2 of the dummy through contact DTC. The contact plug CP may have a third width W3. The third width W3 may indicate a width, which is measured at an arbitrary vertical level, in the first direction D1 or the second direction D2 of the contact plug CP. According to some embodiments, as shown in FIG. 7C, the third width W3 may be greater than the first width W1, and the second width W2 may be greater than the third width W3. According to some embodiments, as shown in FIG. 7D, the second width W2 may be less than the first width W1, and the first width W1 may be less than the third width W3. On an interface between the dummy through contact DTC and the capping through contact CTC, a lateral surface of the dummy through contact DTC may not be aligned with a lateral surface of the capping through contact CTC, and may be offset in the first direction D1 or the second direction D2 from the lateral surface of the capping through contact CTC. For example, on the interface between the dummy through contact DTC and the capping through contact CTC, a stepped structure may be formed at the lateral surfaces of the dummy through contact DTC and the capping through contact CTC. On an interface between the dummy through contact DTC and the contact plug CP, the lateral surface of the dummy through contact DTC may not be aligned with a lateral surface of the contact plug CP, and may be offset in the first direction D1 or the second direction D2 from the lateral surface of the contact plug CP. For example, on the interface between the dummy through contact DTC and the contact plug CP, a stepped structure may be formed at the lateral surfaces of the dummy through contact DTC and the contact plug CP.

FIGS. 8 to 17 illustrate cross-sectional views taken along line II-II' of FIG. 5, showing a method of fabricating a three-dimensional semiconductor memory device according to some embodiments of the present disclosure. With reference to FIGS. 5, 6A, 6B, and 8 to 17, the following will describe in detail a method of fabricating a three-dimensional semiconductor memory device according to some embodiments of the present disclosure.

Referring to FIGS. 5 and 8, a first substrate 10 may be provided which includes a cell array region CAR and a connection region CCR. A device isolation layer 11 may be formed in the first substrate 10, defining an active section. The device isolation layer 11 may be formed by forming a trench on an upper portion of the first substrate 10 and filling the trench with silicon oxide.

Peripheral circuit transistors PTR may be formed on the active section defined by the device isolation layer 11. Peripheral contact plugs 31 and peripheral circuit lines 33 may be formed to be connected to peripheral source/drain sections 29 of the peripheral circuit transistors PTR. A first dielectric layer 30 may be formed to cover the peripheral circuit transistors PTR, the peripheral contact plugs 31, and the peripheral circuit lines 33.

A second substrate 100 may be formed on the first dielectric layer 30. The second substrate 100 may extend from the cell array region CAR toward the contact region CCR.

A portion of the second substrate 100 may be removed from the contact region CCR. The partial removal of the second substrate 100 may include forming a mask pattern that covers the cell array region CAR and a portion of the contact region CCR, and then using the mask pattern to pattern the second substrate 100. The partial removal of the second substrate 100 may include forming a space where a peripheral contact plug TCP will be provided as discussed below.

A first mold structure MS1 may be formed on the second substrate 100. The formation of the first mold structure MS1 may include sequentially stacking a first buffer dielectric layer 111, a first semiconductor layer 121, a second buffer dielectric layer 113, and a second semiconductor layer 123 on the second substrate 100. The first and second buffer dielectric layers 111 and 113 may be formed of, for example, silicon oxide. The first and second semiconductor layers 121 and 123 may be formed of a semiconductor material, such as silicon.

A stack structure ST may be formed on the first mold structure MS1. The stack structure ST may be formed by alternately stacking interlayer dielectric layers ILDa and ILDb and gate electrodes ELa and ELb. For example, the formation of the stack structure ST may include alternately stacking first interlayer dielectric layers ILDa and first sacrificial layers, forming first vertical channel holes CH1 that penetrate the first interlayer dielectric layers ILDa and the first sacrificial layers, forming first channel sacrificial patterns that correspondingly fill the first vertical channel holes CH1, alternately stacking second interlayer dielectric layers ILDb and second sacrificial layers on an uppermost one of the first interlayer dielectric layers ILDa, forming second vertical channel holes CH2 that extend through the second interlayer dielectric layers ILDb and the second sacrificial layers and are connected to the first vertical channel holes CH1, and forming second channel sacrificial patterns that correspondingly fill the second vertical channel holes CH2 and are connected to the first channel sacrificial patterns. The formation of the stack structure ST may further include removing the first and second sacrificial layers in a subsequent procedure, and allowing first and second gate electrodes ELa and ELb to fill spaces from which the first and second sacrificial layers are removed. The first vertical channel holes CH1 may extend through the first mold structure MS1 in addition to the first interlayer dielectric layers ILDa and the first sacrificial layers, and may further extend through at least a portion of the second substrate 100.

The first and second sacrificial patterns may be removed. On the cell array region CAR, vertical channel structures VS may be formed in spaces (or vertical channel holes CH) where the first and second channel sacrificial patterns are removed.

The formation of each of the vertical channel structures VS may include forming a data storage pattern DSP that conformally covers an inner wall of the vertical channel hole CH, forming a vertical semiconductor pattern VSP that conformally covers a sidewall of the data storage pattern DSP, forming a buried dielectric pattern VI that fills at least a portion of a space surrounded by the vertical semiconductor pattern VSP, and forming a conductive pad PAD that fills a space surrounded by the vertical semiconductor pattern VSP and the buried dielectric pattern VI.

A first capping dielectric layer 210 may be formed to cover top surfaces of the vertical channel structures VS, a top surface of an uppermost one of the second interlayer dielectric layers ILDb, a top surface of a cell contact hole CCH, which will be discussed below, and a top surface of a peripheral contact hole TCH, which will be discussed below.

A first trench TR1 may be formed to extend through the first capping dielectric layer 210 and the stack structure ST. The first trench TR1 may further extend through at least a portion of the first mold structure MS1. The first trench TR1 may have a bottom surface located at a lower level than that of a bottom surface of the stack structure ST (or a bottom surface of a lowermost one of the first interlayer dielectric layers ILDa) and that of a top surface of the first mold structure MS1. For example, the bottom surface of the first trench TR1 may be lower than a top surface of the first semiconductor layer 121 and higher than a bottom surface of the first semiconductor layer 121. The first trench TR1 may expose sidewalls of the first and second interlayer dielectric layers ILDa and ILDb and sidewalls of the first and second sacrificial layers. The first trench TR1 may extend from the cell array region CAR toward the contact region CCR.

A preliminary spacer may be formed to partially cover inner sidewall of the first trench TR1. The preliminary spacer may cover the sidewalls of the first and second sacrificial layers, the sidewalls of the first and second interlayer dielectric layers ILDa and ILDb, and a sidewall of the second semiconductor layer 123. The preliminary spacer may include a material having an etch selectivity with respect to the first and second semiconductor layers 121 and 123 and the first and second buffer dielectric layers 111 and 113. The preliminary spacer may include, for example, silicon nitride.

The first semiconductor layer 121 may be selectively removed and is exposed by the first trench TR1 and the preliminary spacer. The selective removal of the first semiconductor layer 121 may be achieved by a wet etching process that uses an etching solution. The first semiconductor layer 121 may be selectively removed to expose the first and second buffer dielectric layers 111 and 113.

The first and second buffer dielectric layers 111 and 113 may be selectively removed. The selective removal of the first and second buffer dielectric layers 111 and 113 may be achieved by a wet etching process that uses an etching solution. When the first and second buffer dielectric layers 111 and 113 are selectively removed, the data storage pattern DSP of each vertical channel structure VS may be partially removed. Therefore, the vertical semiconductor pattern VSP of each vertical channel structure VS may be partially exposed.

The first and second buffer dielectric layers 111 and 113 may be removed from the cell array region CAR, while leaving the first mold structure MS1 on the contact region CCR or a portion of each of the first and second buffer dielectric layers 111 and 113 provided on the contact region CCR.

A first source conductive pattern SCP1 may be formed to fill a space from which the first semiconductor layer 121, the first and second buffer dielectric layers 111 and 113, and a portion of the data storage pattern DSP of each vertical channel structure VS are removed. Although not shown, an air gap may be formed in the first source conductive pattern SCP1. The second semiconductor layer 123 on the cell array region CAR may be called a second source conductive pattern SCP2, and as a result, a source structure SC may be formed to include the first and second source conductive patterns SCP1 and SCP2.

The preliminary spacer may be removed, and this may re-expose the sidewalls of the first and second interlayer dielectric layers ILDa and ILDb and the sidewalls of the first and second sacrificial layers. The first and second sacrificial layers exposed by the first trench TR1 may be selectively removed. The selective removal of the first and second sacrificial layers may be achieved by a wet etching process that uses an etching solution. The first and second gate electrodes ELa and ELb may be formed to fill spaces from which the first and second sacrificial layers are removed. After the formation of the first and second gate electrodes ELa and ELb, a separation spacer 130 and a separation structure 150 may be formed to fill the first trench TR1. The separation structure 150 may have a top surface substantially coplanar with that of the first capping dielectric layer 210. As such, the stack structure ST may be formed to include the first and second gate electrodes ELa and ELb and the first and second interlayer dielectric layers ILDa and ILDb.

A cell contact hole CCH and a peripheral contact hole TCH in which a cell contact plug CCP and a peripheral contact plug TCP are provided may be formed to extend through the stack structure ST and a second dielectric layer 170. An etching process may be employed to form the cell contact hole CCH and the peripheral contact hole TCH. A blocking layer 172 may be conformally formed on inner sidewalls of the cell contact hole CCH and the peripheral contact hole TCH. The blocking layer 172 may include, for example, silicon nitride. A plug sacrificial layer 171 may be formed to fill unoccupied portions of the cell contact hole CCH and the peripheral contact hole TCH. The formation of the blocking layer 172 and the plug sacrificial layer 171 may include, for example, forming the blocking layer 172 that conformally cover an inner surface of each of the cell contact hole CCH and the peripheral contact hole TCH, forming the plug sacrificial layer 171 that fills an unoccupied portion of each of the cell contact hole CCH and the peripheral contact hole TCH, and planarizing the blocking layer 172 and the plug sacrificial layer 171 until a top surface of the second dielectric layer 170 is exposed. The planarization may be achieved by, for example, a chemical mechanical polishing (CMP) process or an etch-back process. The blocking layer 172 may include, for example, silicon nitride.

A second capping dielectric layer 220 and a third capping dielectric layer 230 may be formed on the first capping dielectric layer 210.

Figure 9:
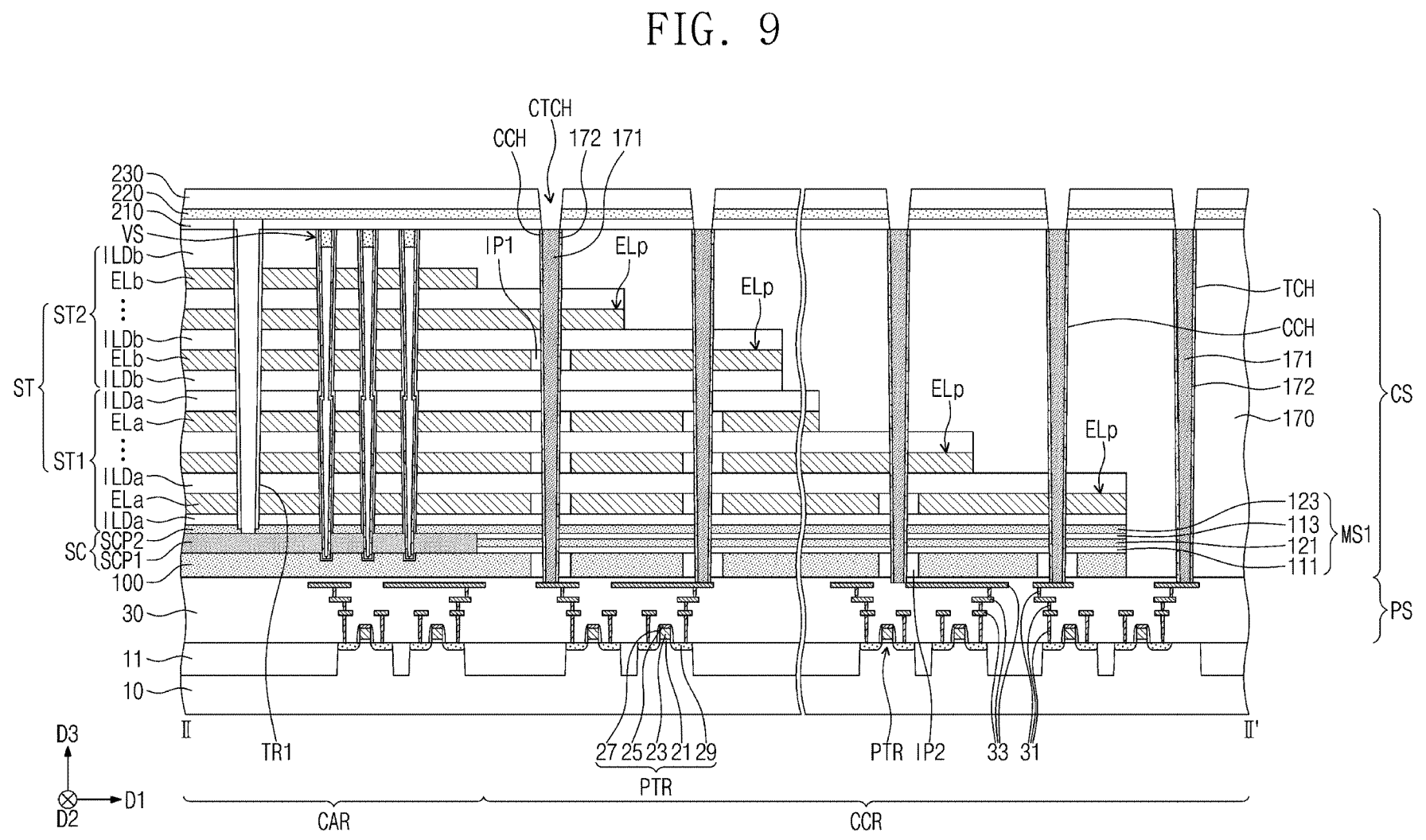

Referring to FIG. 9, a capping through hole CTCH may be formed to extend through the first capping dielectric layer 210, the second capping dielectric layer 220, and the third capping dielectric layer 230. The capping through hole CTCH may be formed to vertically overlap (e.g., in a third direction D3) with the cell contact hole CCH and the peripheral contact hole TCH. The capping through hole CTCH may be formed by an etching process.

Figure 10:
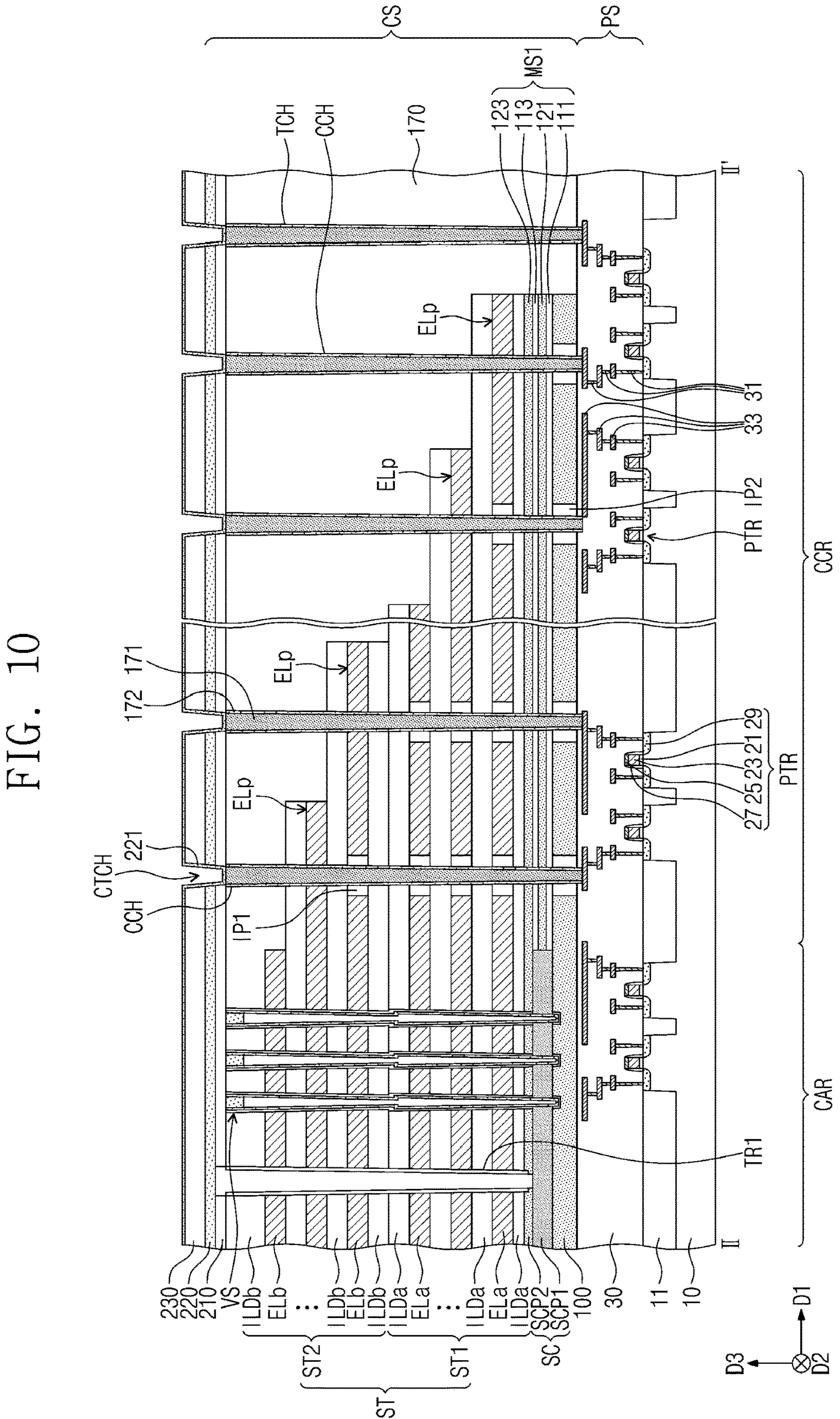

Referring to FIG. 10, a spacer dielectric layer 221 may be formed to conformally cover an inner sidewall and a bottom surface of the capping through hole CTCH. The spacer dielectric layer 221 may extend onto a top surface of the third capping dielectric layer 230. The spacer dielectric layer 221 may be formed by using a layer-formation technique, such as chemical vapor deposition (CVD), physical vapor deposition (PVD), or atomic layer deposition (ALD), having superior step coverage properties. The spacer dielectric layer 221 may include, for example, silicon oxide.

As the spacer dielectric layer 221 is formed and before the formation of a cell contact plug CCP and a peripheral contact plug TCP, which will be discussed below, a portion of the second capping dielectric layer 220 may not be etched when removing the blocking layer 172 formed on the inner sidewalls of the cell contact hole CCH and the peripheral contact hole TCH. Accordingly, a three-dimensional semiconductor memory device according to the present disclosure may improve in reliability and electrical properties.

Figure 11:
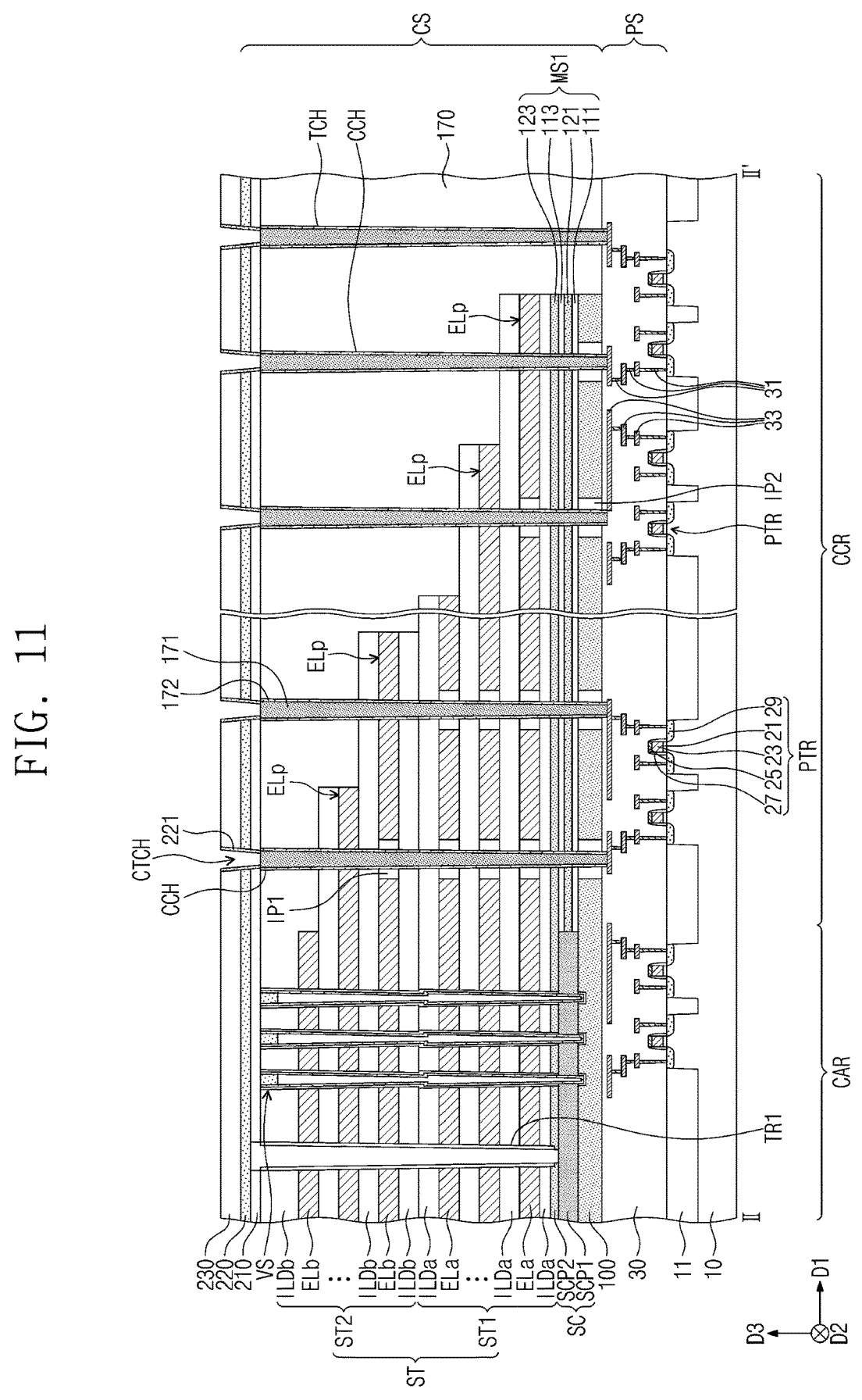

Referring to FIG. 11, the spacer dielectric layer 221 may be partially removed by an etch-back process. Therefore, the plug sacrificial layer 171 in the cell contact hole CCH may be exposed at its top surface. The spacer dielectric layer 221 that covers an inner sidewall of the capping through hole CTCH may not be removed.

Figure 12:
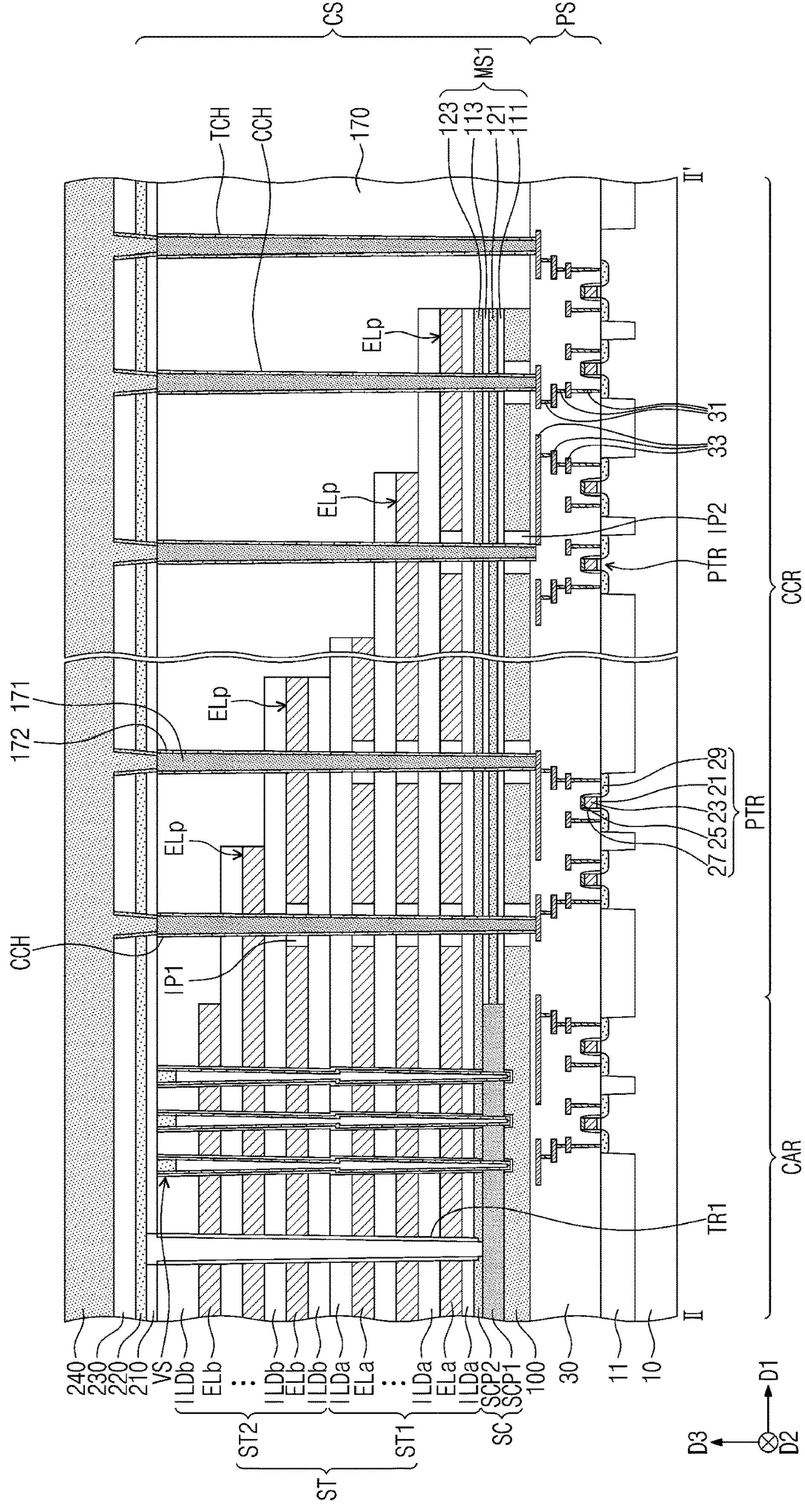

Referring to FIG. 12, a selection semiconductor layer 240 may be formed on the third capping dielectric layer 230, filling an unoccupied portion of the capping through hole CTCH. The selection semiconductor layer 240 may extend onto the top surface of the third capping dielectric layer 230.

Figure 13:
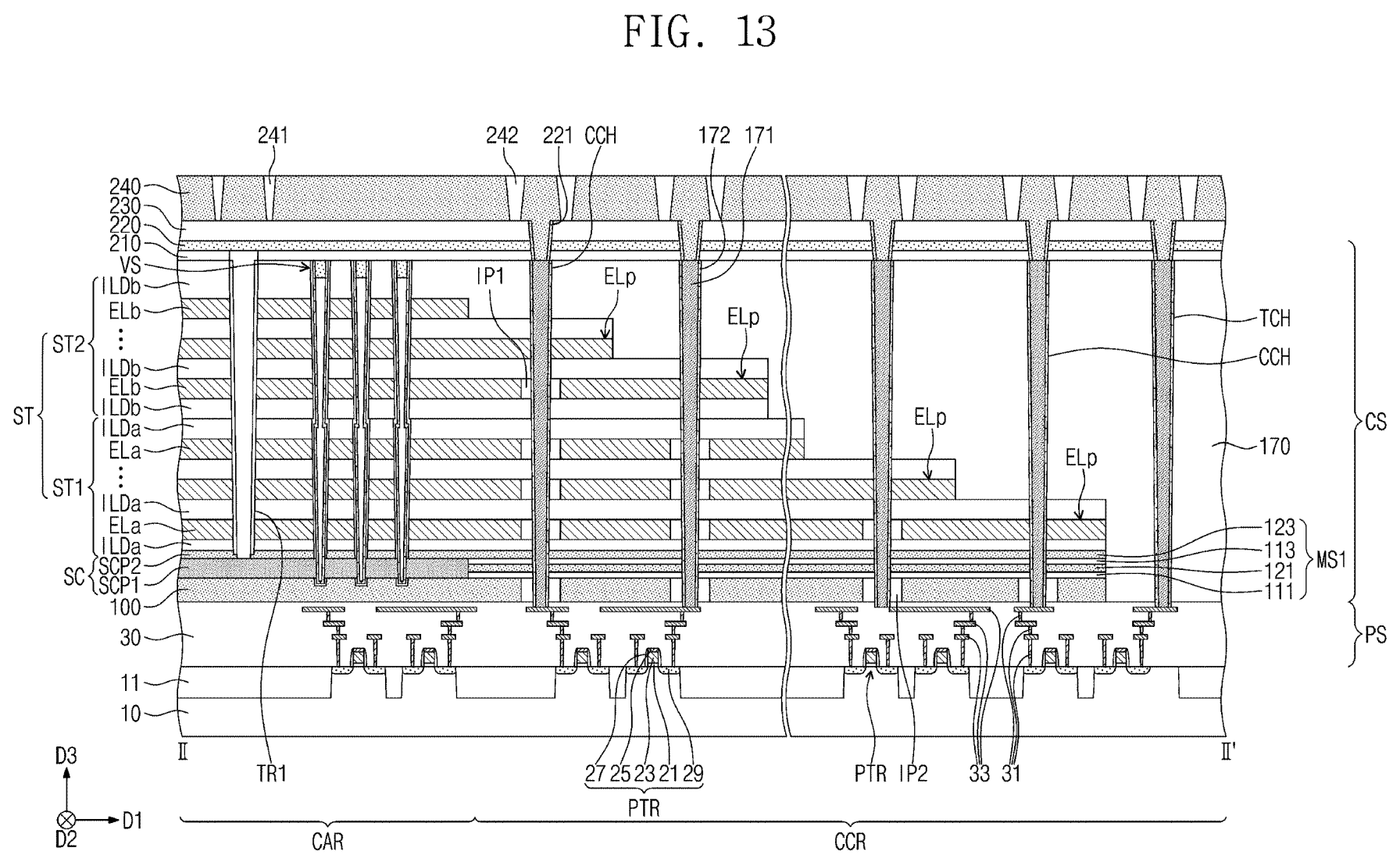

Referring to FIG. 13, a separation dielectric pattern 241 may be formed to extend in a first direction D1 across the selection semiconductor layer 240. The separation dielectric pattern 241 may extend along the first direction D1. During an etching process by which the separation dielectric pattern 241 is formed, a separation dummy pattern 242 may be formed simultaneously. Referring together to FIGS. 5 and 9, the separation dummy pattern 242 may be formed to have an annular shape in the selection semiconductor layer 240 and on the capping through hole CTCH. When viewed in plan, the separation dummy pattern 242 may surround a portion of the selection semiconductor layer 240 on the capping through hole CTCH. A dielectric material may fill an inside of each of the separation dielectric pattern 241 and the separation dummy pattern 242. The dielectric material may be formed by using a layer-formation technique, such as chemical vapor deposition (CVD), physical vapor deposition (PVD), or atomic layer deposition (ALD), having superior step coverage properties, and may be planarized until a top surface of the selection semiconductor layer 240 is exposed. The planarization may be achieved by, for example, a chemical mechanical polishing (CMP) process or an etch-back process. According to the present disclosure, the separation dummy pattern 242 may decrease in critical dimension (CD), and thus dishing and/or erosion may be prevented while the dielectric material is planarized. As such, the present disclosure may allow a three-dimensional semiconductor memory device to have improved reliability and electrical properties. The separation dielectric pattern 241 and the separation dummy pattern 242 may be filled with, for example, silicon oxide.

Figure 14:
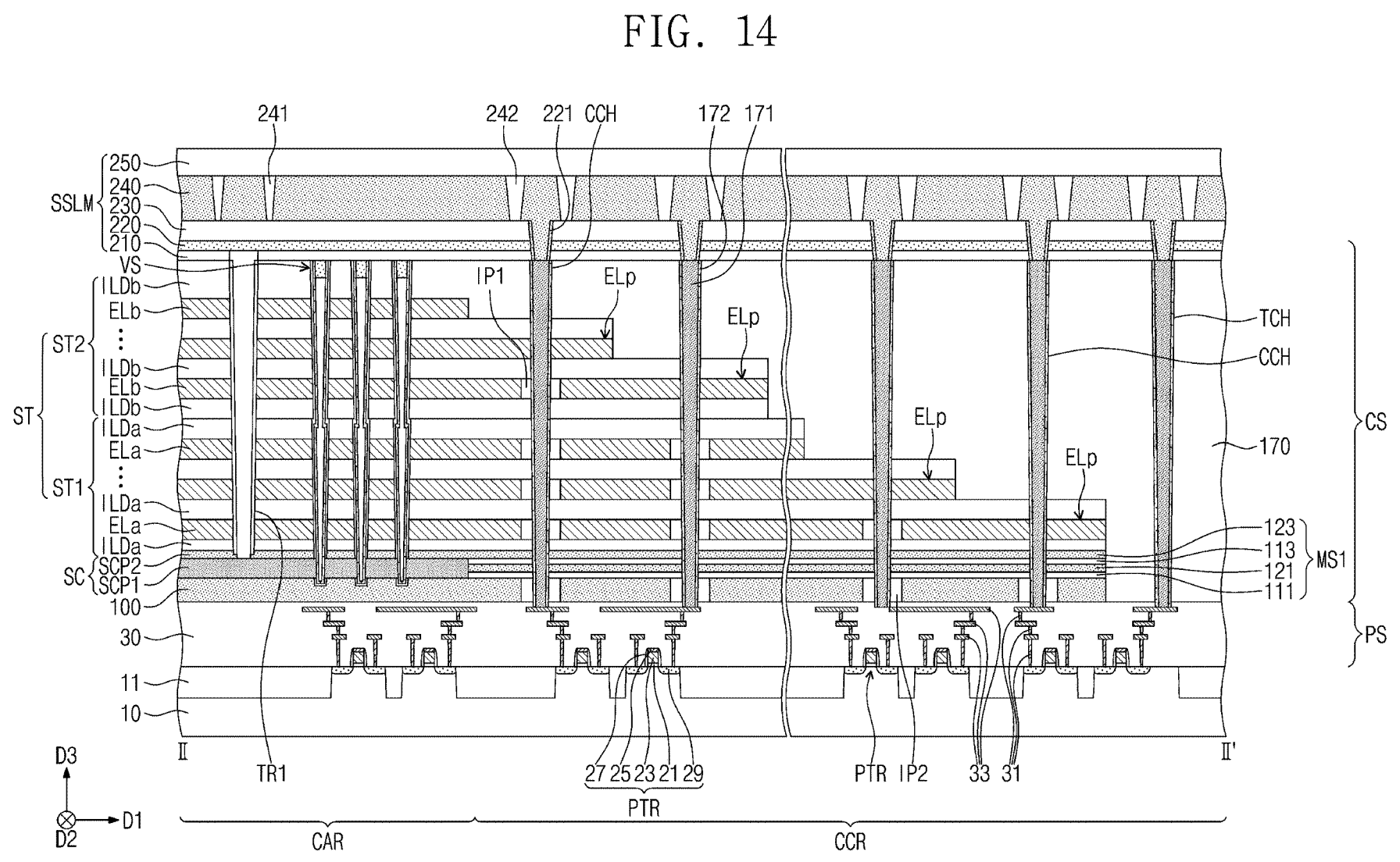

Referring to FIG. 14, a mold dielectric layer 250 may be formed on the top surface of the selection semiconductor layer 240. The first capping dielectric layer 210, the second capping dielectric layer 220, the third capping dielectric layer 230, the selection semiconductor layer 240, and the mold dielectric layer 250 may constitute a selection mold structure SSLM.

Figure 15:
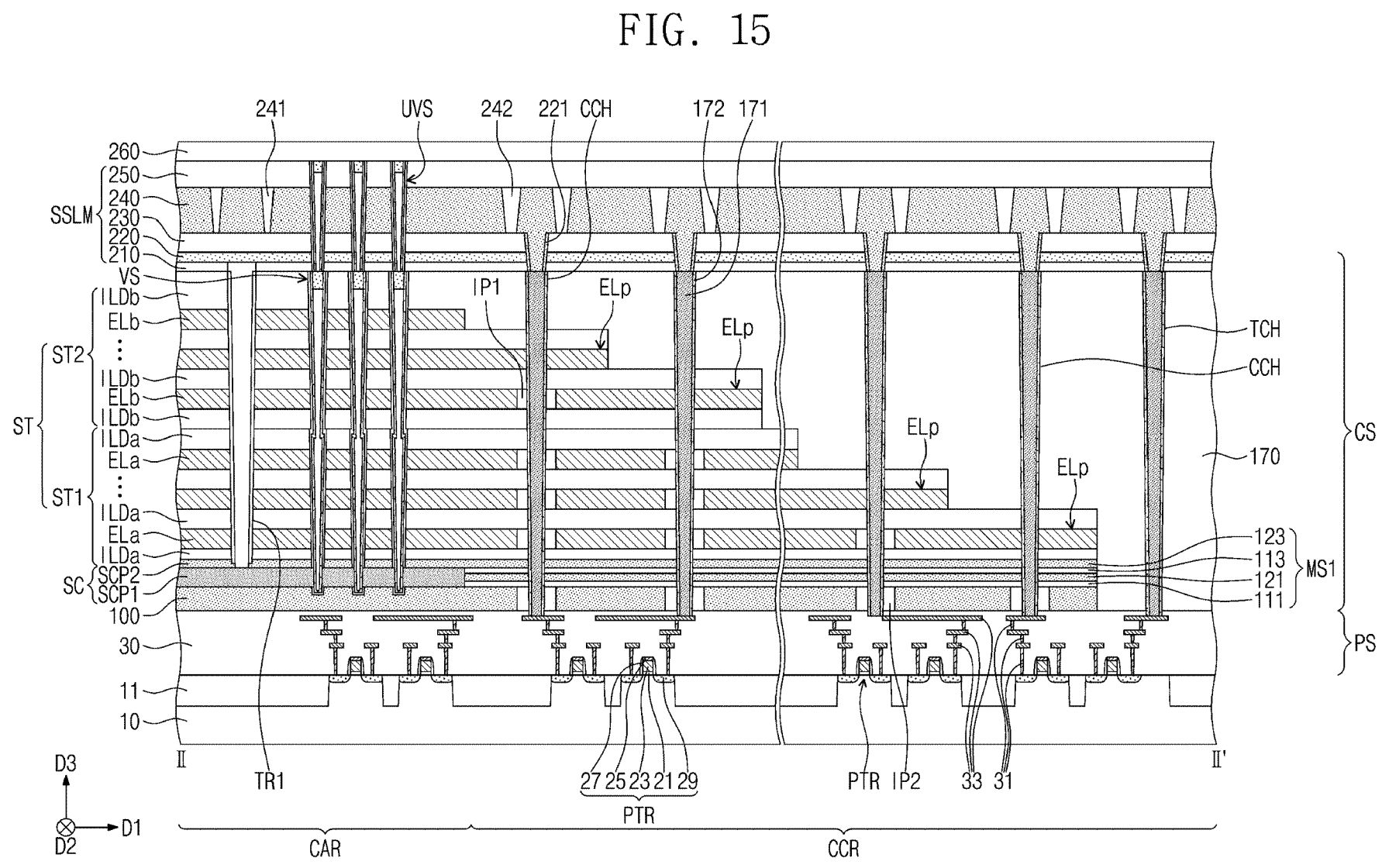

Referring to FIG. 15, on the cell array region CAR, upper vertical channel structures UVS may be formed to penetrate the selection mold structure SSLM. The formation of the upper vertical channel structures UVS may be substantially the same as the formation of the vertical channel structures VS discussed above. A third dielectric layer 260 may be formed to cover the mold dielectric layer 250 and a top surface of the upper vertical channel structure UVS.

Figure 16:
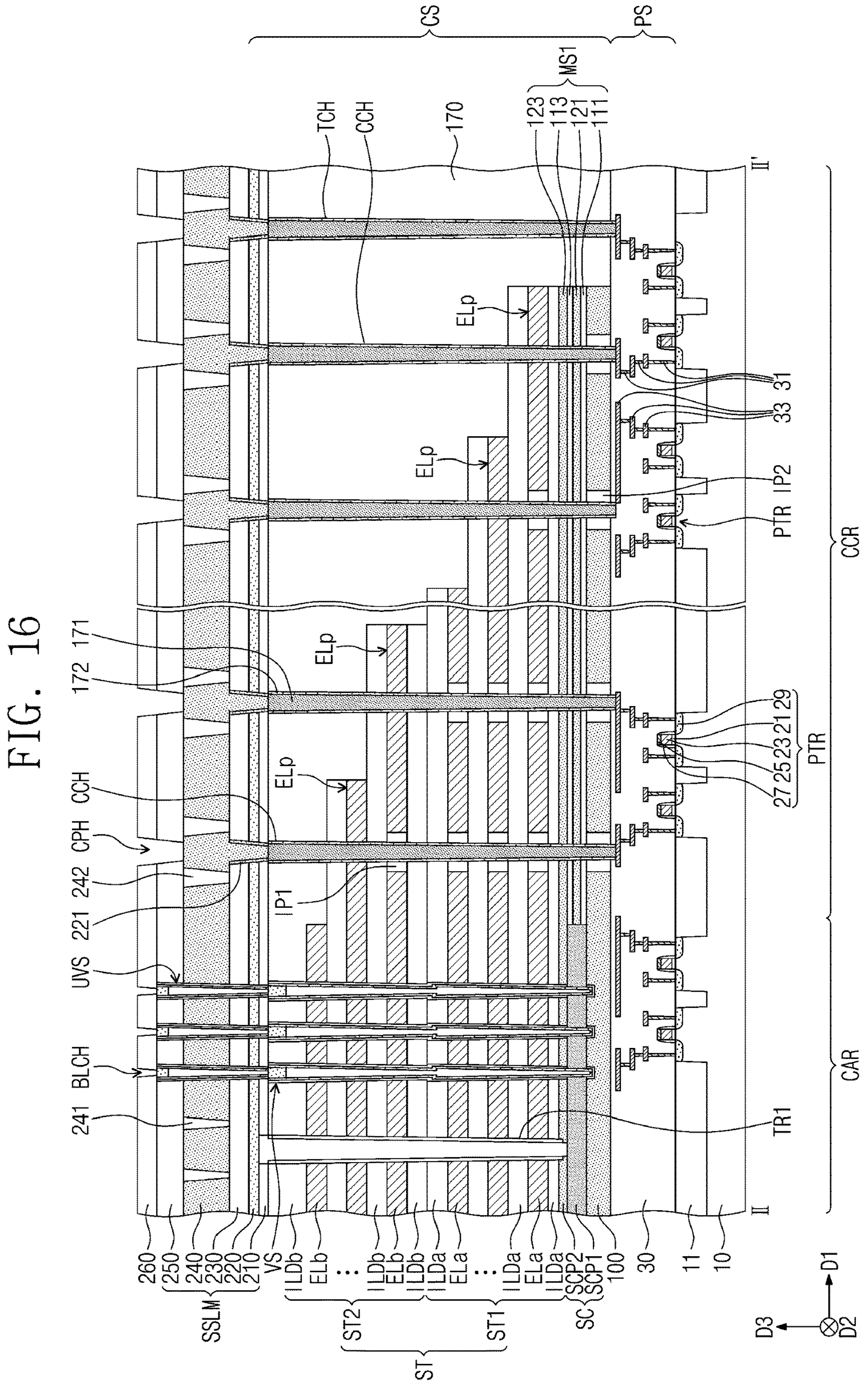

Referring to FIG. 16, a contact plug hole CPH may be formed to extend through the mold dielectric layer 250 and the third dielectric layer 260. The contact plug hole CPH may expose the top surface of the selection semiconductor layer 240 between the separation dummy patterns 242. A bit-line contact hole BLCH may be formed to extend through the third dielectric layer 260. The bit-line contact hole BLCH may expose a conductive pad of the upper vertical channel structure UVS.

Figure 17:
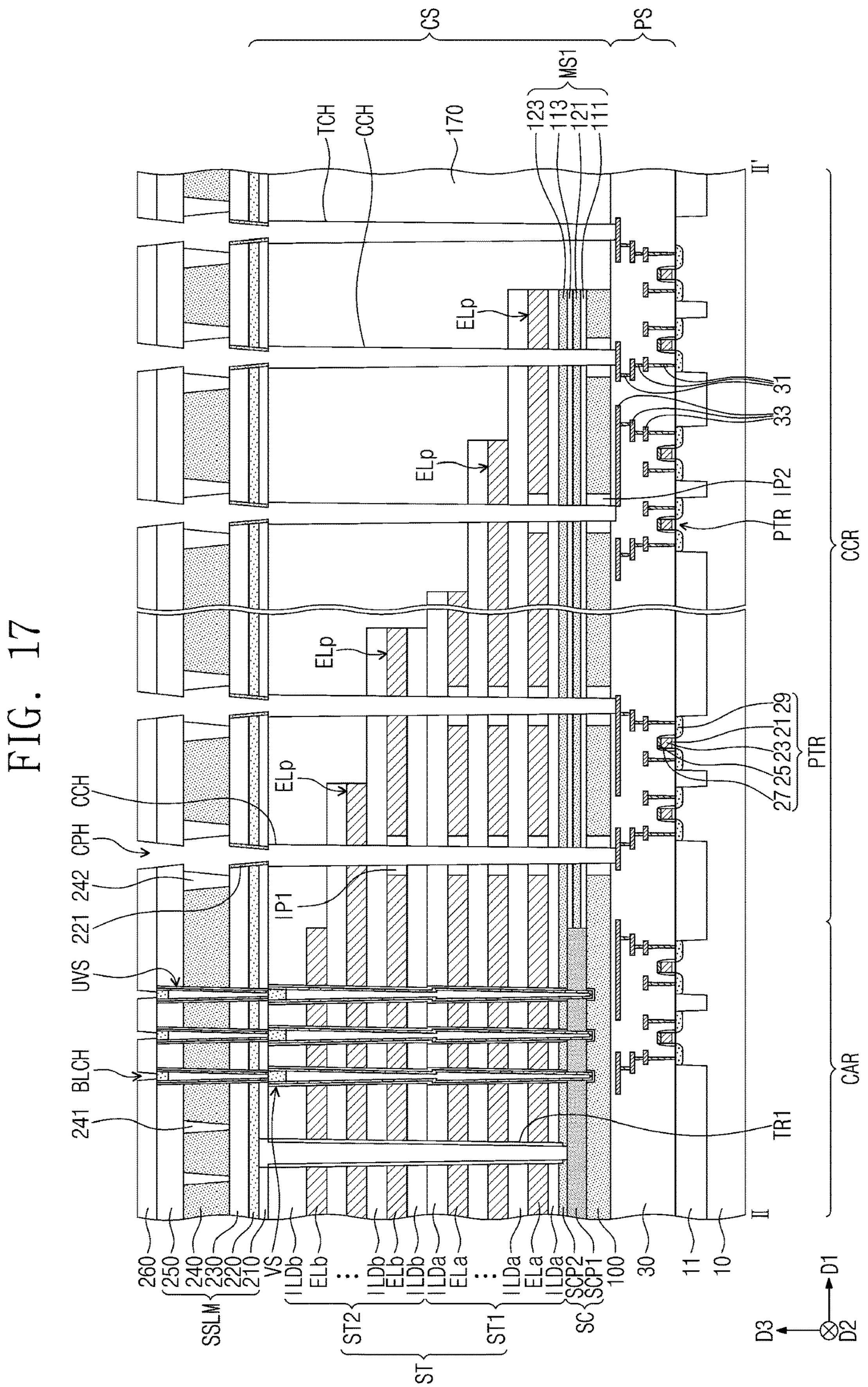

Referring to FIG. 17, a portion of the selection semiconductor layer 240 surrounded by the separation dummy pattern 242, another portion of the selection semiconductor layer 240 that fills the capping through hole CTCH between the spacer dielectric layers 221, the plug sacrificial layer 171, and the blocking layer 172 may be selectively removed. The selective removal may be performed by a wet etching process that uses an etching solution. It may thus be possible to expose sidewalls of the separation dummy pattern 242, the spacer dielectric layer 221, the first and second interlayer dielectric layers ILDa and ILDb, the first and second gate electrodes ELa and ELb, and the first dielectric pattern IP1. The spacer dielectric layer 221 may prevent the second capping dielectric layer 220 from being partially etched in the etching process, and thus it may be possible to improve reliability and electrical properties of a three-dimensional semiconductor memory device according to the present disclosure.

Referring back to FIGS. 5, 6A, and 6B, on the cell array region CAR, bit-line contact plugs BLCP may be formed to extend through the third dielectric layer 260. On the contact region CCR, contact plugs CP may be formed to extend through the third dielectric layer 260 and the mold dielectric layer 250. On the contact region CCR, a dummy through contact DTC may be formed between the separation dummy patterns 242 of the selection semiconductor layer 240. On the contact region CCR, a capping through contact CTC may be formed to extend through the third capping dielectric layer 230, the second capping dielectric layer 220, and the first capping dielectric layer 210. The capping through contact CTC may be formed between the spacer dielectric layers 221. On the contact region CCR, a cell contact plug CCP may be formed to extend through the second dielectric layer 170, the stack structure ST, the first mold structure MS1, the second substrate 100, and at least a portion of the first dielectric layer 30. On the contact region CCR, a peripheral contact plug TCP may be formed to extend through the second dielectric layer 170 and at least a portion of the first dielectric layer 30. On the third dielectric layer 260, bit lines BL may be formed to be connected to the bit-line contact plugs BLCP, first conductive lines CL1 may be formed to be connected to the cell contact plugs CCP, and a second conductive line CL2 may be formed to be connected to the peripheral contact plug TCP.

Figure 18:
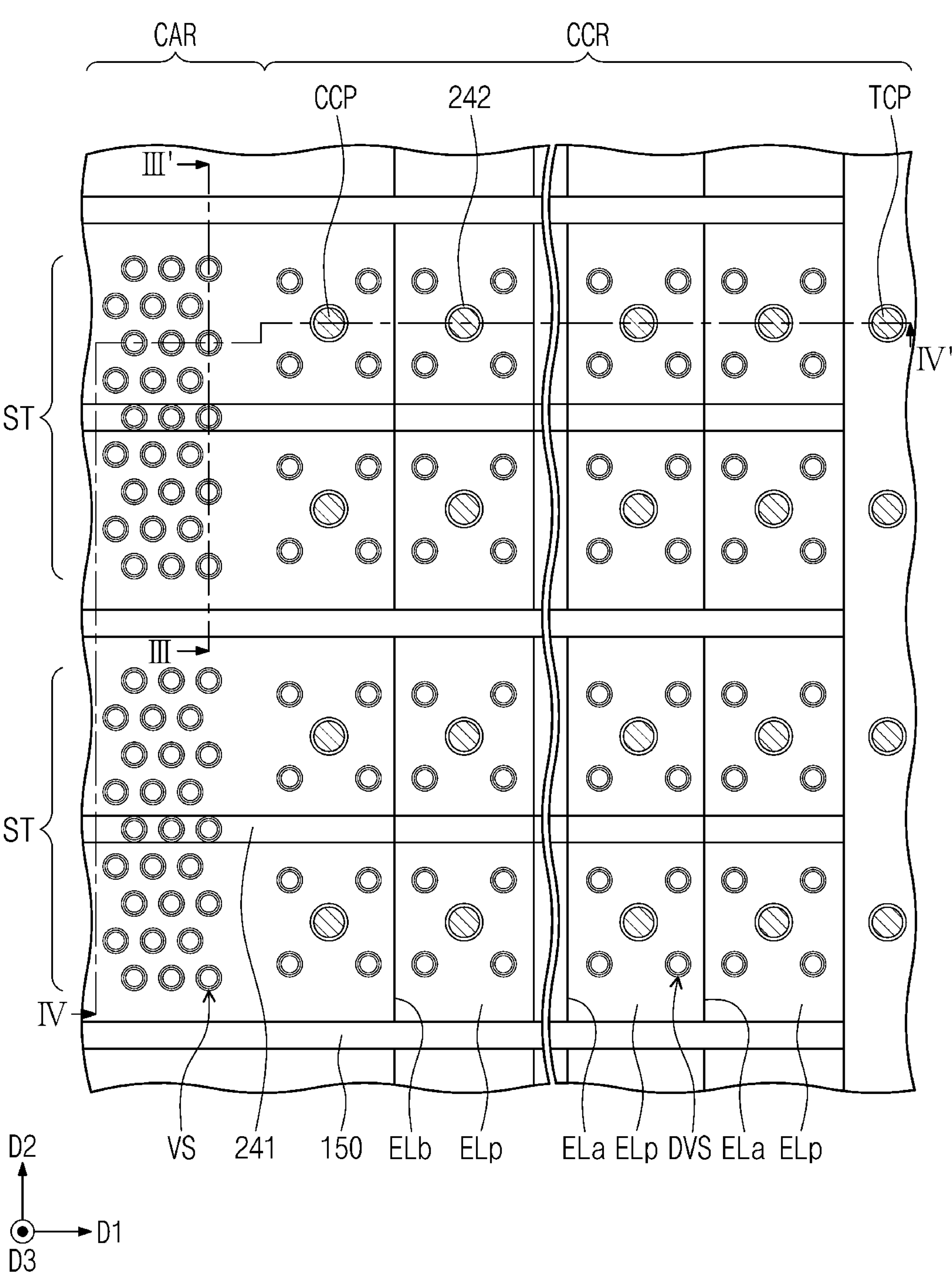
FIG. 18 illustrates a plan view showing a three-dimensional semiconductor memory device according to some embodiments of the present disclosure.
Figure 19A:
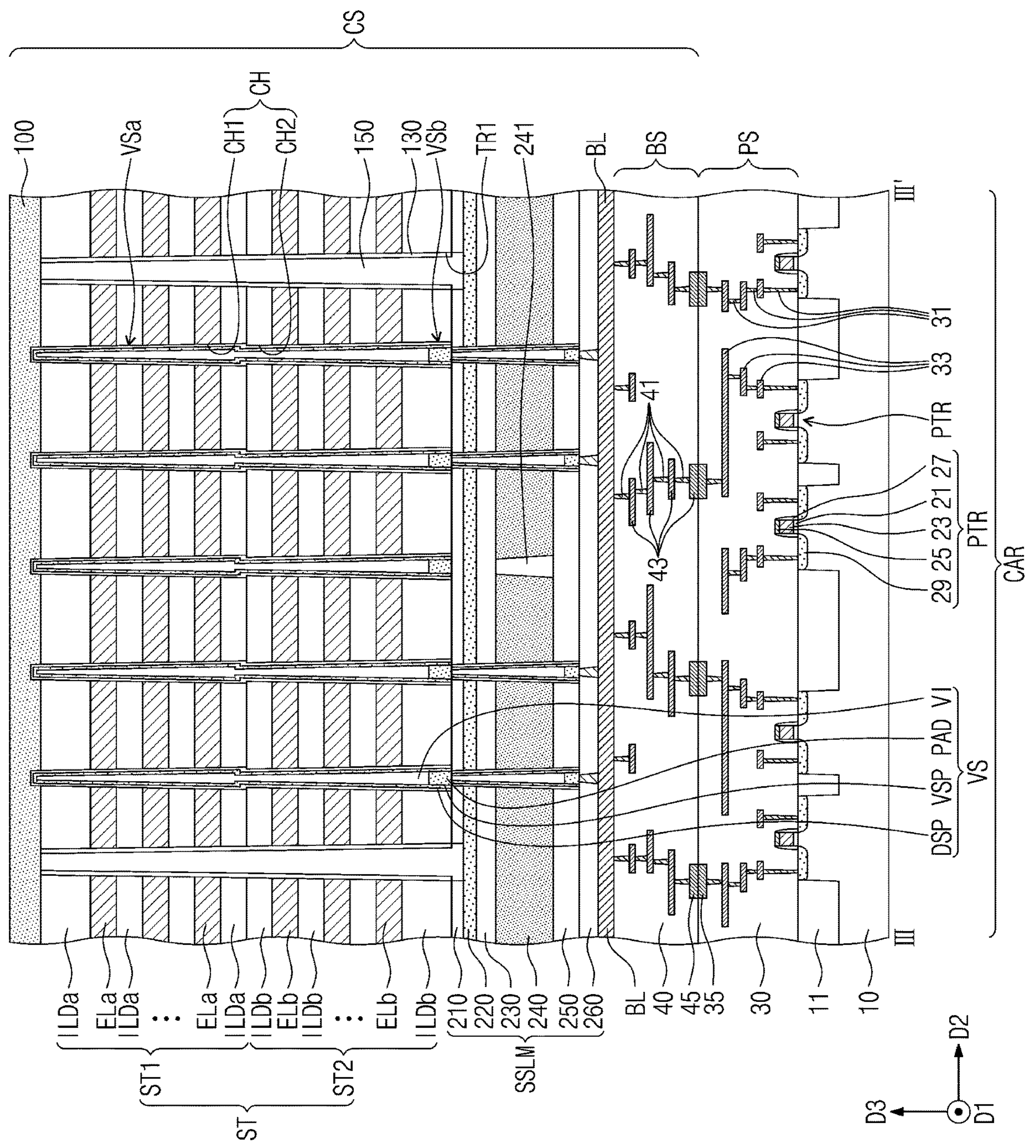
FIGS. 19A and 19B illustrate cross-sectional views respectively taken along lines III-III' and IV-IV' of FIG. 18.
Figure 19B:
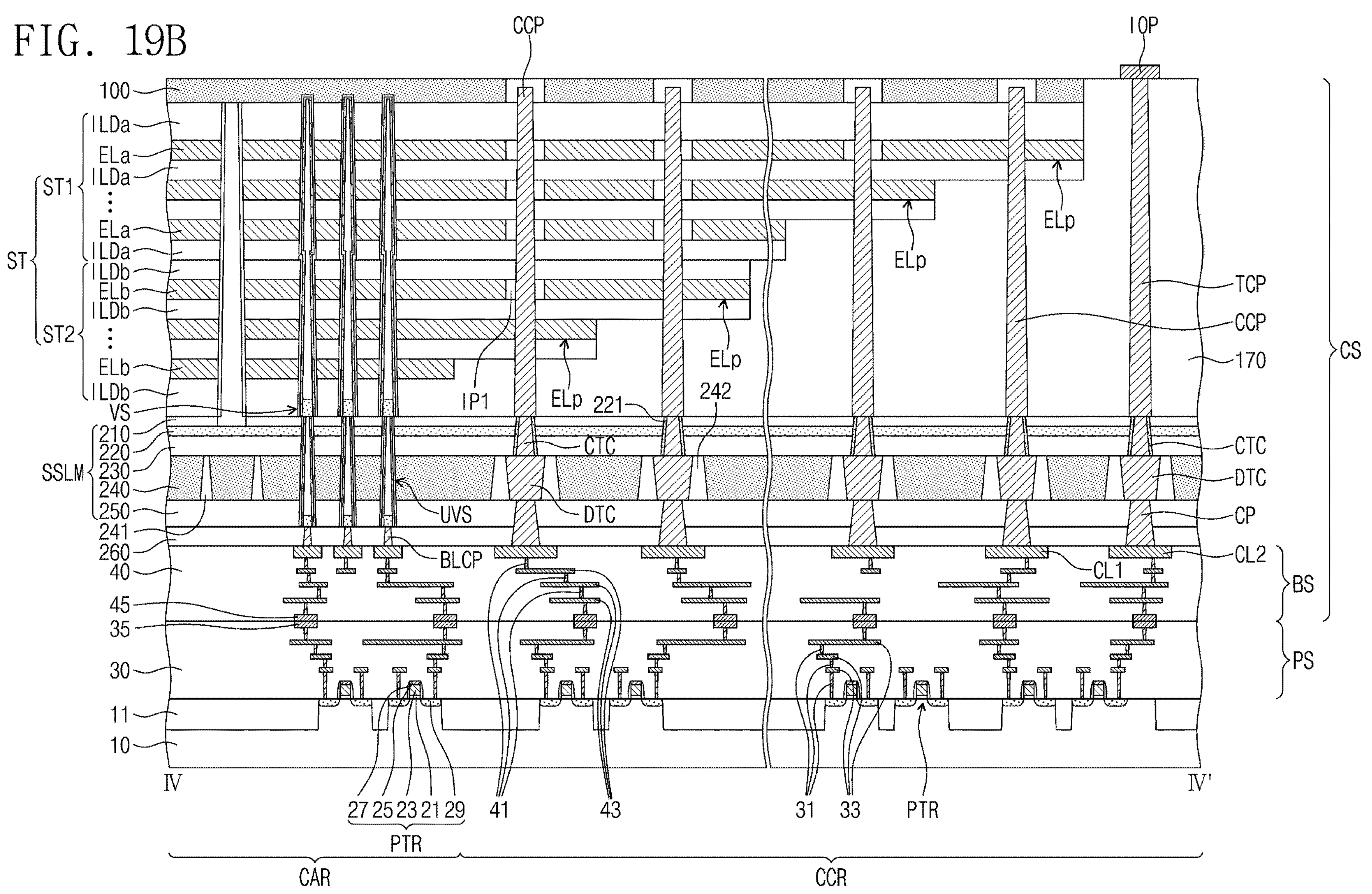

FIG. 18 illustrates a plan view showing a three-dimensional semiconductor memory device according to some embodiments of the present disclosure. FIGS. 19A and 19B illustrate cross-sectional views respectively taken along lines III-III' and IV-IV' of FIG. 18, showing a three-dimensional semiconductor memory device according to some embodiments of the present disclosure. For convenience of description, omission will be made to avoid a repetitive explanation of the same components discussed with reference to FIGS. 5, 6A, and 6B, and a difference thereof will be described in detail.

Referring to FIGS. 18, 19A, and 19B, a first substrate 10 may be provided thereon with a peripheral circuit structure PS including peripheral circuit transistors PTR, peripheral contact plugs 31, peripheral circuit lines 33 electrically connected to the peripheral circuit transistors PTR through the peripheral contact plugs 31, first bonding pads 35 electrically connected to the peripheral circuit lines 33, and a first dielectric layer 30 that surrounds the peripheral circuit transistors PTR, the peripheral contact plugs 31, the peripheral circuit lines 33, and the first bonding pads 35. The first dielectric layer 30 may not cover top surfaces of the first bonding pads 35. The first dielectric layer 30 may have a top surface substantially coplanar with those of the first bonding pads 35.

The peripheral circuit structure PS may be provided thereon with a cell array structure CS including a bonding structure BS, a stack structure ST, a selection mold structure SSLM, and a second substrate 100. The second substrate 100 may be provided on the stack structure ST. The stack structure ST may be provided between the second substrate 100 and the peripheral circuit structure PS. The bonding structure BS may be provided between the peripheral circuit structure PS and the cell array structure CS.

The bonding structure BS may include second bonding pads 45 on the first dielectric layer 30 and contact the first bonding pads 35 of the peripheral circuit structure PS, connection contact plugs 41, connection circuit lines 43 electrically connected to the second bonding pads 45 through the connection contact plugs 41, and a fourth dielectric layer 40 that surrounds the second bonding pads 45, the connection contact plugs 41, and the connection circuit lines 43. The fourth dielectric layer 40 may include a plurality of dielectric layers that constitute a multi-layered structure. The fourth dielectric layer 40 may include, for example, one or more of silicon oxide, silicon nitride, silicon oxynitride, and low-k dielectric materials. The connection contact plugs 41 may each have a width in a first direction D1 or a second direction D2 that decreases in a third direction D3 (or decreases with increasing distance from the first substrate 10). The connection contact plugs 41 and the connection circuit lines 43 may include a conductive material, such as metal.

The fourth dielectric layer 40 may not cover bottom surfaces of the second bonding pads 45. The fourth dielectric layer 40 may have a bottom surface substantially coplanar with those of the second bonding pads 45. The bottom surfaces of the second bonding pads 45 may be correspondingly in direct contact with the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu). The first bonding pad 35 and the second bonding pad 45 may constitute a single unitary body (i.e., a monolithic body) with no interface therebetween. Although the first and second bonding pads 35 and 45 are illustrated to have their sidewalls aligned with each other, the present disclosure are not limited thereto, and when viewed in plan, the first and second bonding pads 35 and 45 may have their sidewalls spaced apart from each other.

The fourth dielectric layer 40 may be provided in its upper portion with bit lines BL and first and second conductive lines CL1 and CL2 in contact with the connection contact plugs 41. The fourth dielectric layer 40 may be provided thereon with a third dielectric layer 260, a mold dielectric layer 250, a selection semiconductor layer 240, a third capping dielectric layer 230, a second capping dielectric layer 220, and a first capping dielectric layer 210 that are sequentially stacked, and a stack structure ST and a second dielectric layer 170 may be provided on the first capping dielectric layer 210.

First gate electrodes ELa of a first stack structure ST1 and second gate electrodes ELb of a second stack structure ST2 may have their lengths in a first direction D1 that increase with increasing distance from the first substrate 10. When viewed in plan as shown in FIG. 18, the first and second gate electrodes ELa and ELb may have their sidewalls that are spaced apart from each other at a regular interval along the first direction D1. A lowermost one of the second gate electrodes ELb included in the second stack structure ST2 may have a minimum length in the first direction D1, and an uppermost one of the first gate electrodes ELa included in the first stack structure ST1 may have a maximum length in the first direction D1. Likewise, the first and second gate electrode ELa and ELb, first and second interlayer dielectric layers ILDa and ILDb may have their lengths in the first direction D1 that increase with increasing distance from the first substrate 10.

Bit-line contact plugs BLCP, contact plugs CP, capping through contacts CTC, cell contact plugs CCP, a peripheral contact plug TCP, and vertical channel structures VS may each have a width in the first direction D1 or the second direction D2 that decreases in the third direction D3. A separation structure 150 may have a width in the second direction D2 that decreases in the third direction D3.

The second dielectric layer 170 may be provided thereon with an input/output pad IOP electrically connected through the peripheral contact plug TCP to at least one of the peripheral circuit transistors PTR included in the peripheral circuit structure PS. The input/output pad IOP may correspond to the input/output pad 1101 of FIG. 1 or one of the input/output pads 2210 of FIGS. 3 and 4.

As the cell array structure CS is bonded to the peripheral circuit structure PS, it may be possible to increase a cell capacity per unit area of a three-dimensional semiconductor memory device according to the present disclosure. In addition, as the peripheral circuit structure PS and the cell array structure CS are manufactured separately and then bonded to each other, damage to the peripheral transistors PTR may be prevented due to various heat treatment processes, and accordingly, it may be possible to improve the reliability and electrical properties of a three-dimensional semiconductor memory device according to the present disclosure.

According to the present disclosure, a three-dimensional semiconductor memory device may include a peripheral circuit structure, a stack structure, and a selection mold structure on the stack structure. As a separation dummy pattern is formed in the selection mold structure, it may be possible to prevent deterioration in step difference due to dishing and/or erosion in a subsequent planarization procedure or a chemical mechanical polishing (CMP) process. In addition, a spacer dielectric may be additionally provided between a capping through contact and the selection mold structure, and thus it may be possible to fabricate a three-dimensional semiconductor memory device whose reliability and electrical properties are improved in a subsequent process for forming a contact plug.

Although the present disclosure has been described in connection with some embodiments of the present disclosure illustrated in the accompanying drawings, it will be understood by one of ordinary skill in the art that variations in form and detail may be made therein without departing from the spirit and features of the present disclosure. The above disclosed embodiments should thus be considered illustrative and not restrictive.

What is claimed is:

1. A three-dimensional semiconductor memory device, comprising:

a first substrate that includes a cell array region and a contact region that extends from the cell array region;

a stack structure that includes interlayer dielectric layers and gate electrodes that are alternately stacked on the first substrate;

a second dielectric layer on the stack structure;

a cell contact plug that extends through the second dielectric layer and the contact region of the stack structure;

a selection mold structure on the stack structure and the second dielectric layer;

a third dielectric layer on the selection mold structure; and a capping through contact and a dummy through contact that extend through the selection mold structure and are connected to the cell contact plug, wherein the dummy through contact has a second width in a direction that is parallel to a top surface of the first substrate, wherein the capping through contact has a first width in the direction that is parallel to the top surface of the first substrate, wherein the second width is different from the first width, and wherein the selection mold structure includes a selection semiconductor layer.

2. The three-dimensional semiconductor memory device of claim 1, further comprising a contact plug that extends through the third dielectric layer, wherein the contact plug has a third width in the direction that is parallel to the top surface of the first substrate, and wherein the second width is different from the third width.

3. The three-dimensional semiconductor memory device of claim 2, wherein the second width is greater than the first width, and wherein the third width is greater than the first width.

4. The three-dimensional semiconductor memory device of claim 2, wherein the third width is greater than the first width, and wherein the first width is greater than the second width.

5. The three-dimensional semiconductor memory device of claim 1, wherein the selection semiconductor layer includes polycrystalline silicon.

6. The three-dimensional semiconductor memory device of claim 5, wherein a top surface of the dummy through contact is coplanar with a top surface of the selection semiconductor layer.

7. The three-dimensional semiconductor memory device of claim 1, wherein the selection mold structure includes:

a first capping dielectric layer;

a second capping dielectric layer;

a third capping dielectric layer;

the selection semiconductor layer; and a mold dielectric layer, wherein the first capping dielectric layer and the third capping dielectric layer include silicon oxide, and the second capping dielectric layer includes a silicon nitride layer.

8. The three-dimensional semiconductor memory device of claim 1, wherein the cell contact plug, the dummy through contact, and the capping through contact include tungsten (W).

9. The three-dimensional semiconductor memory device of claim 1, further comprising:

a peripheral circuit structure that includes peripheral circuit transistors on the first substrate;

a second substrate on the peripheral circuit structure;

a source structure between the stack structure and the second substrate; and a vertical channel structure in a vertical channel hole that extends through the stack structure and the source structure, wherein the vertical channel structure includes a data storage pattern and a vertical semiconductor pattern that are on an inner sidewall of the vertical channel hole, and wherein the source structure contacts a sidewall of the vertical semiconductor pattern of the vertical channel structure.

10. The three-dimensional semiconductor memory device of claim 9, further comprising an upper vertical channel structure that extends through the selection mold structure, wherein a lower portion of the upper vertical channel structure is connected to an upper portion of the vertical channel structure.

11. The three-dimensional semiconductor memory device of claim 9, further comprising a mold structure between the stack structure and the second substrate, wherein the mold structure includes a first buffer dielectric layer, a first semiconductor layer on the first buffer dielectric layer, a second buffer dielectric layer on the first semiconductor layer, and a second semiconductor layer on the second buffer dielectric layer.

12. The three-dimensional semiconductor memory device of claim 9, further comprising a plurality of cell contact plugs and a mold structure between the second substrate and the stack structure, wherein the plurality of cell contact plugs extend through the stack structure, the mold structure, and the second substrate and are connected to the peripheral circuit transistors, and wherein each of the plurality of cell contact plugs is in contact with one of the gate electrodes and is spaced apart from others of the gate electrodes across a first dielectric pattern and in a direction that is parallel to a top surface of the second substrate.

13. The three-dimensional semiconductor memory device of claim 12, wherein each of the plurality of cell contact plugs is spaced apart in the direction parallel to the top surface of the second substrate from the second substrate across a second dielectric pattern, and the first dielectric pattern, the second dielectric pattern, and the interlayer dielectric layers of the stack structure include a same material.

14. A three-dimensional semiconductor memory device, comprising:

a first substrate that includes a cell array region and a contact region that extends from the cell array region;

a stack structure that includes interlayer dielectric layers and gate electrodes that are alternately stacked on the first substrate;

a second dielectric layer on the stack structure;

a cell contact plug that extends through the second dielectric layer and the contact region of the stack structure;

a selection mold structure on the stack structure and the second dielectric layer;

a third dielectric layer on the selection mold structure;

a capping through contact and a dummy through contact that extend through the selection mold structure and are connected to the cell contact plug; and a spacer dielectric layer between the selection mold structure and a sidewall of the capping through contact, wherein the selection mold structure includes a selection semiconductor layer.

15. The three-dimensional semiconductor memory device of claim 14, wherein the spacer dielectric layer includes silicon oxide.

16. The three-dimensional semiconductor memory device of claim 14, wherein an upper portion of the spacer dielectric layer contacts a lower portion of the dummy through contact, and a lower portion of the spacer dielectric layer contacts an upper portion of the cell contact plug.

17. The three-dimensional semiconductor memory device of claim 14, wherein a top surface of the spacer dielectric layer is coplanar with a bottom surface of the selection semiconductor layer.

18. An electronic system, comprising:

a first substrate that includes a cell array region and a contact region that extends from the cell array region;

a three-dimensional semiconductor memory device that includes a peripheral circuit structure on the first substrate, a cell array structure on the peripheral circuit structure, a dielectric layer on the cell array structure, and an input/output pad on the dielectric layer and connected to the peripheral circuit structure; and a controller connected to the three-dimensional semiconductor memory device through the input/output pad, wherein the cell array structure includes:

a second substrate on the peripheral circuit structure;

a stack structure that includes interlayer dielectric layers and gate electrodes that are alternately stacked on the second substrate;

a second dielectric layer on the stack structure;

a cell contact plug that extends through the second dielectric layer and the contact region of the stack structure;

a selection mold structure on the stack structure and the second dielectric layer;

a third dielectric layer on the selection mold structure; and a capping through contact and a dummy through contact that extend through the selection mold structure and are connected to the cell contact plug, wherein the dummy through contact has a second width in a direction that is parallel to a top surface of the first substrate, wherein the capping through contact has a first width in the direction that is parallel to the top surface of the first substrate, wherein the second width is greater than the first width, and wherein the selection mold structure includes a selection semiconductor layer.

19. The electronic system of claim 18, further comprising a spacer dielectric layer between the selection mold structure and a sidewall of the capping through contact.

20. The electronic system of claim 18, wherein the peripheral circuit structure includes:

peripheral circuit transistors on the first substrate; and first bonding pads connected to the peripheral circuit transistors, wherein the cell array structure further includes:

conductive lines connected to cell contact plugs;

vertical channel structures that extend through the stack structure on the cell array region;

bit lines connected to the vertical channel structures; and second bonding pads connected to the conductive lines and the bit lines, wherein the first bonding pads and the second bonding pads are integrally connected into a single unitary body.

* * * * *